United States Patent [19]
Shubat et al.

[11] Patent Number: 6,051,031
[45] Date of Patent: *Apr. 18, 2000

[54] MODULE-BASED LOGIC ARCHITECTURE AND DESIGN FLOW FOR VLSI IMPLEMENTATION

[75] Inventors: Alexander Shubat, Fremont; Adam Kablanian, San Jose; Vardan Duvalyan, Sunnyvale, all of Calif.

[73] Assignee: Virage Logic Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/795,580

[22] Filed: Feb. 5, 1997

[51] Int. Cl.[7] .................................................. G06F 17/50
[52] U.S. Cl. .................................. 716/3; 703/15
[58] Field of Search .................. 364/489, 490, 364/491, 488, 578

[56] References Cited

U.S. PATENT DOCUMENTS

| | | | |
|---|---|---|---|
| 4,566,064 | 1/1986 | Whitaker | 364/489 |
| 4,622,648 | 11/1986 | Whitaker | 364/715 |
| 4,870,302 | 9/1989 | Freeman | 307/465 |
| 4,912,348 | 3/1990 | Maki et al. | 307/465 |
| 5,148,387 | 9/1992 | Yano et al. | 364/784 |
| 5,289,021 | 2/1994 | El Gamal | 257/206 |
| 5,502,648 | 3/1996 | Kaplan | 364/490 |
| 5,508,641 | 4/1996 | Appenzeller et al. | 326/113 |
| 5,734,581 | 3/1998 | Buts et al. | 364/489 |
| 5,796,623 | 8/1998 | Buts et al. | 364/489 |

OTHER PUBLICATIONS

Mead et al, "Introduction to VLSI Systems," (Addison–Wesley Publ. Co., Inc., 1980), pp. 22–24, and 76–79.

Preas et al, Physical Design Automation of VLSI Systems, (The Benjamin/Cummings Publ. Co., 1988), pp. 31–61, 65–76, 78, 283–338.

Radhakrishnan et al, "Formal Design Procedures for Pass Transistor Switching Circuits," *IEEE Journal of Solid–State Circuits*, vol. SC–20, No. 2, Apr. 1985, pp. 531–536.

Shubat et al, "Differential Pass Transistor Logic in CMOS Technology," *Electronic Letters*, vol. 22, No. 6, Mar. 1996, pp. 294–295.

Yano et al, "Top–Down Pass–Transistor Logic Design," *IEEE Journal of Solid–Sate Circuits*, vol. 31, No. 6, Jun. 1996, pp. 792–803.

*Primary Examiner*—Kevin J. Teska
*Assistant Examiner*—Thuan Do
*Attorney, Agent, or Firm*—Skjerven Morril MacPherson Franklin & Friel LLP; Barmak S. Sani

[57] ABSTRACT

A new design methodology which utilizes a module-based architecture is used to implement customized VLSI designs. In accordance with this invention, the module-based architecture comprises a number of Matrix Transistor Logic (MTL) modules. Each MTL module has a control input buffer section, an output stage section, and a matrix array section. The matrix array section implements logic functions using Pass Transistor Logic technology. Three variables, each of which place a different constraint on the MTL modules, are used in an automated design procedure to implement the MTL modules.

74 Claims, 30 Drawing Sheets

| | RST | AS | CLK | AL[7:0] AH[7:0] | A 1/1 | B | C | D | E | F | G | H | BE |
|---|---|---|---|---|---|---|---|---|---|---|---|---|---|
| 1 | T | X | X | X | 0 | 0 | 0 | 0 | 0 | 0 | 0 | 0 | 0 |
| 2 | F | F | ↑ | X | 0 | 0 | 0 | 0 | 0 | 0 | 0 | 0 | BE |
| 3 | F | T | 0 | X | A | B | C | D | E | F | G | H | BE |
| 4 | F | T | ↑ | FFFF to F000 | 1 | 0 | 0 | 0 | 0 | 0 | 0 | 0 | 0 |
| 5 | F | T | ↑ | EFFF to E800 | 0 | 1 | 0 | 0 | 0 | 0 | 0 | 0 | 0 |
| 6 | F | T | ↑ | E7FF to E400 | 0 | 0 | 1 | 0 | 0 | 0 | 0 | 0 | 0 |
| 7 | F | T | ↑ | E3FF to E300 | 0 | 0 | 0 | 1 | 0 | 0 | 0 | 0 | 0 |
| 8 | F | T | ↑ | E2FF to E2C0 | 0 | 0 | 0 | 0 | 1 | 0 | 0 | 0 | 0 |
| 9 | F | T | ↑ | E2BF to E2B0 | 0 | 0 | 0 | 0 | 0 | 1 | 0 | 0 | 0 |
| 10 | F | T | ↑ | E2AF to E2AC | 0 | 0 | 0 | 0 | 0 | 0 | 1 | 0 | 0 |
| 11 | F | T | ↑ | E2AB | 0 | 0 | 0 | 0 | 0 | 0 | 0 | 1 | 0 |
| 12 | F | T | ↑ | E2AA to 0000 | 0 | 0 | 0 | 0 | 0 | 0 | 0 | 0 | 1 |

TABLE 1

Verilog-HDL description

// Memory Map Circuit

```
1   module memmap(H, G, F, E, D, C, B, A, BE, CLK, RST, AS, AL, AH);
2   output H, G, F, E, D, C, B, A, BE;
3   input CLK, RST, AS;
4   input [7:0] AL, AH;
5   reg BE;
6   reg [7:0] Q;

7   wire [15:0] addr = {AH, AL}; // combine AH and AL into one address bus
8   assign {H, G, F, E, D, C, B, A} = Q; // split Q bus into individual output bits 9   always @(posedge CLK or posedge RST)
10  begin
11          if (RST) begin
12                  Q = 0;
13                  BE = 0;
14          end else if (!AS) begin
15                  Q = 0; // BE remains unchanged
16          end else begin // rising CLK edge
17                  Q = 0;
18                  BE = 0;
19                  if (addr <= 16'he2aa)
20                          BE = 1;
21                  else if (addr == 16'he2ab)
22                          Q[7] = 1;
23                  else if (addr <= 16'he2af)
24                          Q[6] = 1;
25                  else if (addr <= 16'he2bf)
26                          Q[5] = 1;
27                  else if (addr <= 16'he2ff)
28                          Q[4] = 1;
29                  else if (addr <= 16'he3ff)
30                          Q[3] = 1;
31                  else if (addr <= 16'he7ff)
32                          Q[2] = 1;
33                  else if (addr <= 16'hefff)
34                          Q[1] = 1;
35                  else Q[0] = 1; // addr <= 16'hffff
36          end
37  end 38  endmodule
```

FIG. 10

Synthesis Library

```
    LIBRARY VIRTSMC5(
1     GATE GND (
2       INPUTS ;
3       OUTPUTS O;

4       FUNCTION (
5         O = CONST0;
6       );
7           SET LIBVER = "2.0.0";
8     );

9     GATE VDD (
10      INPUTS ;
11      OUTPUTS O;

12      FUNCTION (
13        O = CONST1;
14      );
15          SET LIBVER = "2.0.0";
16    );

17    GATE BUF (
18      INPUTS I;
19      OUTPUTS O;

20      FUNCTION (
21        O = I;
22      );
23          SET SCHNM = "BUF";
24      INPUT I (set alias = "I0"; DELAY O (PROP = ( 0.0 , 0.0 );););
25          SET XNF_INPUT;
26          SET LIBVER = "2.0.0";
27    );

28    GATE INV (
29      INPUTS I;
30      OUTPUTS O;

31      FUNCTION (
32        O = !I;
33      );
34          SET SCHNM = "INV";
35      INPUT I (set alias = "I0"; DELAY O (PROP = ( 0.2 , 0.2 );););
36          SET XNF_INPUT;
37          SET LIBVER = "2.0.0";
```

FIG. 11

Synthesis Library (cont.)

```
38  );

39  GATE FD (
40    INPUTS D, C, GR;
41    OUTPUTS Q;

42        NOMAP;
43    FUNCTION (
44        _GR = !GR;
45      DFFE (-, _GR, D, C, -, Q, -);
46    );
47        SET SCHNM = "FD";
48        SET XNF_INPUT;
49    SET XNF_ALIAS = "DFF";

50    INPUT D (
51      DELAY C (
52        SETUP = ( 0.0, 0.0 );
53        HOLD = ( 0.0, 0.0 );
54      );
55    );
56      INPUT C (DELAY Q (PROP = ( 1.0, 1.0 );););
57      INPUT GR (DELAY Q (PROP = ( 1.0, 1.0 );); SET FLOATVAL = 1; );

58        SET "DFF" = 1 ;
59        SET LIBVER = "2.0.0";
60  );

61  GATE EQN2 (

62    INPUTS I0, I1;
63    OUTPUTS O;

64    FUNCTION ();
65        SET XNF_INPUT;
66        SET SAME_TECH_NOOPT;
67        SET XNF_ALIAS = "EQN";
68    INPUT I0, I1 (
69      DELAY (
70        PROP = (0.51 ,0.51);
71        PHASE = UNKNOWN;
72      );
73    );
74        SET LIBVER = "2.0.0";
75  );

76  GATE EQN3 (

77    INPUTS I0, I1, I2;
78    OUTPUTS O;

79    FUNCTION ();
80        SET XNF_INPUT;
81        SET SAME_TECH_NOOPT;
82        SET XNF_ALIAS = "EQN";
```

FIG. 11 (cont.)

Synthesis Library (cont.)

```
83      INPUT I0, I1, I2 (
84        DELAY (
85          PROP = (0.69, 0.69);
86          PHASE = UNKNOWN;
87        );
88      );
89          SET LIBVER = "2.0.0";
90    );

91    GATE EQN4 (

92      INPUTS I0, I1, I2, I3;
93      OUTPUTS O;

94      FUNCTION ();
95          SET XNF_INPUT;
96          SET SAME_TECH_NOOPT;
97          SET XNF_ALIAS = "EQN";
98      INPUT I0, I1, I2, I3 (
99        DELAY (
100         PROP = (0.90, 0.90);
101         PHASE = UNKNOWN;
102       );
103     );
104         SET LIBVER = "2.0.0";
105   );

106   GATE EQN5 (

107     INPUTS I0, I1, I2, I3, I4;
108     OUTPUTS O;

109     FUNCTION ();
110         SET XNF_INPUT;
111         SET SAME_TECH_NOOPT;
112         SET XNF_ALIAS = "EQN";
113     INPUT I0, I1, I2, I3, I4 (
114       DELAY (
115         PROP = (1.13, 1.13);
116         PHASE = UNKNOWN;
117       );
118     );
119         SET LIBVER = "2.0.0";
120   );

121   GATE EQN6 (

122     INPUTS I0, I1, I2, I3, I4, I5;
123     OUTPUTS O;

124     FUNCTION ();
125         SET XNF_INPUT;
126         SET SAME_TECH_NOOPT;
127         SET XNF_ALIAS = "EQN";
128     INPUT I0, I1, I2, I3, I4, I5 (
```

FIG. 11 (cont.)

Synthesis Library (cont.)

```
129      DELAY (
130         PROP = (1.5, 1.5);
131         PHASE = UNKNOWN;
132      );
133   );
134      SET LIBVER = "2.0.0";
135   );
136  GATE EQN7 (

137     INPUTS I0, I1, I2, I3, I4, I5, I6;
138     OUTPUTS O;

139     FUNCTION ();
140        SET XNF_INPUT;
141        SET SAME_TECH_NOOPT;
142        SET XNF_ALIAS = "EQN";
143     INPUT I0, I1, I2, I3, I4, I5, I6 (
144        DELAY (
145           PROP = (2.0, 2.0);
146           PHASE = UNKNOWN;
147        );
148     );
149        SET LIBVER = "2.0.0";
150   );
151  GATE EQN8 (

152     INPUTS I0, I1, I2, I3, I4, I5, I6, I7;
153     OUTPUTS O;

154     FUNCTION ();
155        SET XNF_INPUT;
156        SET SAME_TECH_NOOPT;
157        SET XNF_ALIAS = "EQN";
158     INPUT I0, I1, I2, I3, I4, I5, I6, I7 (
159        DELAY (
160           PROP = (2.5, 2.5);
161           PHASE = UNKNOWN;
162        );
163     );
164        SET LIBVER = "2.0.0";
165   );

166  GATE EQN9 (

167     INPUTS I0, I1, I2, I3, I4, I5, I6, I7, I8;
168     OUTPUTS O;

169     FUNCTION ();
170        SET XNF_INPUT;
171        SET SAME_TECH_NOOPT;
172        SET XNF_ALIAS = "EQN";
173     INPUT I0, I1, I2, I3, I4, I5, I6, I7, I8 (
174        DELAY (
175           PROP = (3.0, 3.0);
176           PHASE = UNKNOWN;
177        );
178     );
179        SET LIBVER = "2.0.0";
180   );
```

FIG. 11 (cont.)

Decomposition into 5-input equations (F=5)

```
1   SIG, AH<0>,s,PIN=AH<0>
2   SIG, AH<1>,s,PIN=AH<1>
3   SIG, AH<2>,s,PIN=AH<2>
4   SIG, AH<3>,s,PIN=AH<3>
5   SIG, AH<4>,s,PIN=AH<4>
6   SIG, AH<5>,s,PIN=AH<5>
7   SIG, AH<6>,s,PIN=AH<6>
8   SIG, AH<7>,s,PIN=AH<7>
9   SIG, AL<0>,s,PIN=AL<0>
10  SIG, AL<1>,s,PIN=AL<1>
11  SIG, AL<2>,s,PIN=AL<2>
12  SIG, AL<3>,s,PIN=AL<3>
13  SIG, AL<4>,s,PIN=AL<4>
14  SIG, AL<5>,s,PIN=AL<5>
15  SIG, AL<6>,s,PIN=AL<6>
16  SIG, AL<7>,s,PIN=AL<7>
17  SIG, AS,s,PIN=AS
18  SIG, RST,s,PIN=RST
19  SIG, CLK,s,PIN=CLK
20  SIG, BE,s,PIN=BE
21  SIG, A,s,PIN=A
22  SIG, B,s,PIN=B
23  SIG, C,s,PIN=C
24  SIG, D,s,PIN=D
25  SIG, E,s,PIN=E
26  SIG, F,s,PIN=F
27  SIG, G,s,PIN=G
28  SIG, H,s,PIN=H
29  SYM, XMPLR_INST_129, DFF,SCHNM=FDC,LIBVER=2.0.0
30  PIN, D, I, XMPLR_NET_120, ,
31  PIN, C, I, CLK, ,
32  PIN, CLR, I, RST, ,
33  PIN, Q, O, BE, 1.000000,
34  END
35  SYM, XMPLR_INST_137, DFF,SCHNM=FDC,LIBVER=2.0.0
36  PIN, D, I, XMPLR_NET_104, ,
37  PIN, C, I, CLK, ,
38  PIN, CLR, I, RST, ,
39  PIN, Q, O, H, 1.000000,
40  END
41  SYM, XMPLR_INST_145, DFF,SCHNM=FDC,LIBVER=2.0.0
42  PIN, D, I, XMPLR_NET_106, ,
43  PIN, C, I, CLK, ,
44  PIN, CLR, I, RST, ,
45  PIN, Q, O, G, 1.000000,
46  END
47  SYM, XMPLR_INST_153, DFF,SCHNM=FDC,LIBVER=2.0.0
48  PIN, D, I, XMPLR_NET_108, ,
```

FIG. 12

Decomposition into 5-input equations (F=5) (cont.)

```
49   PIN, C, I, CLK, ,
50   PIN, CLR, I, RST, ,
51   PIN, Q, O, F, 1.000000,
52   END
53   SYM, XMPLR_INST_161, DFF,SCHNM=FDC,LIBVER=2.0.0
54   PIN, D, I, XMPLR_NET_110, ,
55   PIN, C, I, CLK, ,
56   PIN, CLR, I, RST, ,
57   PIN, Q, O, E, 1.000000,
58   END
59   SYM, XMPLR_INST_169, DFF,SCHNM=FDC,LIBVER=2.0.0
60   PIN, D, I, XMPLR_NET_112, ,
61   PIN, C, I, CLK, ,
62   PIN, CLR, I, RST, ,
63   PIN, Q, O, D, 1.000000,
64   END
65   SYM, XMPLR_INST_177, DFF,SCHNM=FDC,LIBVER=2.0.0
66   PIN, D, I, XMPLR_NET_114, ,
67   PIN, C, I, CLK, ,
68   PIN, CLR, I, RST, ,
69   PIN, Q, O, C, 1.000000,
70   END
71   SYM, XMPLR_INST_185, DFF,SCHNM=FDC,LIBVER=2.0.0
72   PIN, D, I, XMPLR_NET_116, ,
73   PIN, C, I, CLK, ,
74   PIN, CLR, I, RST, ,
75   PIN, Q, O, B, 1.000000,
76   END
77   SYM, XMPLR_INST_193, DFF,SCHNM=FDC,LIBVER=2.0.0
78   PIN, D, I, XMPLR_NET_118, ,
79   PIN, C, I, CLK, ,
80   PIN, CLR, I, RST, ,
81   PIN, Q, O, A, 1.000000,
82   END
83   SYM, EQN3_XMPLR_NET_118, EQN,EQN=((I0*I1*I2)),LIBVER=2.0.0
84   PIN, I0, I, AS, ,
85   PIN, I1, I, AH<4>, ,
86   PIN, I2, I, n2798, ,
87   PIN, O, O, XMPLR_NET_118, 0.689999,
88   END
89   SYM, EQN4_XMPLR_NET_116, EQN,EQN=((I0*I1*~I2*I3)),LIBVER=2.0.0
90   PIN, I0, I, AS, ,
91   PIN, I1, I, AH<3>, ,
92   PIN, I2, I, AH<4>, ,
93   PIN, I3, I, n2798, ,
94   PIN, O, O, XMPLR_NET_116, 0.899999,
95   END
96   SYM, EQN5_XMPLR_NET_114, EQN,EQN=((I0*I1*~I2*~I3*I4)),LIBVER=2.0.0
97   PIN, I0, I, AS, ,
98   PIN, I1, I, AH<2>, ,
99   PIN, I2, I, AH<3>, ,
100  PIN, I3, I, AH<4>, ,
101  PIN, I4, I, n2798, ,
102  PIN, O, O, XMPLR_NET_114, 1.129999,
103  END
```

FIG. 12 (cont.)

Decomposition into 5-input equations (F=5) (cont.)

```
104  SYM, EQN4_XMPLR_NET_112, EQN,EQN=((I0*I1*I2*I3)),LIBVER=2.0.0
105  PIN, I0, I, AH<0>,,
106  PIN, I1, I, AH<1>,,
107  PIN, I2, I, n2635,,
108  PIN, I3, I, n2798,,
109  PIN, O, O, XMPLR_NET_112, 0.899999,
110  END
111  SYM, EQN4_XMPLR_NET_108, EQN,EQN=((I0*~I1*I2*I3)),LIBVER=2.0.0
112  PIN, I0, I, AL<4>,,
113  PIN, I1, I, AL<6>,,
114  PIN, I2, I, n2644,,
115  PIN, I3, I, n2937,,
116  PIN, O, O, XMPLR_NET_108, 0.899999,
117  END
118  SYM, EQN4_XMPLR_NET_106, EQN,EQN=((I0*I1*I2*I3)),LIBVER=2.0.0
119  PIN, I0, I, AL<2>,,
120  PIN, I1, I, AL<3>,,
121  PIN, I2, I, n2644,,
122  PIN, I3, I, n2800,,
123  PIN, O, O, XMPLR_NET_106, 0.899999,
124  END
125  SYM, i3558, EQN,EQN=((I0*~I1*~I2*~I3)),LIBVER=2.0.0
126  PIN, I0, I, AS,,
127  PIN, I1, I, AH<2>,,
128  PIN, I2, I, AH<3>,,
129  PIN, I3, I, AH<4>,,
130  PIN, O, O, n2635, 0.899999,
131  END
132  SYM, i3563, EQN,EQN=((I0*I1*I2*I3)),LIBVER=2.0.0
133  PIN, I0, I, AL<5>,,
134  PIN, I1, I, AL<7>,,
135  PIN, I2, I, AH<1>,,
136  PIN, I3, I, n2798,,
137  PIN, O, O, n2644, 0.899999,
138  END
139  SYM, i3567, EQN,EQN=((I0*I1*I2)),LIBVER=2.0.0
140  PIN, I0, I, AH<5>,,
141  PIN, I1, I, AH<6>,,
142  PIN, I2, I, AH<7>,,
143  PIN, O, O, n2798, 0.689999,
144  END
145  SYM, i3571, EQN,EQN=((~I0*~I1*I2)),LIBVER=2.0.0
146  PIN, I0, I, AL<4>,,
147  PIN, I1, I, AL<6>,,
148  PIN, I2, I, n2937,,
149  PIN, O, O, n2800, 0.689999,
150  END
151  SYM, i3577, EQN,EQN=((~I0*I2)+(~I1*I3)+(I0*~I4)),LIBVER=2.0.0
152  PIN, I0, I, AS,,
153  PIN, I1, I, AH<1>,,
154  PIN, I2, I, BE,,
155  PIN, I3, I, n2635,,
156  PIN, I4, I, n2798,,
157  PIN, O, O, n2831, 1.129999,
158  END
```

FIG. 12 (cont.)

Decomposition into 5-input equations (F=5) (cont.)

```
159  SYM, EQN5_XMPLR_NET_104, EQN,EQN=((~I0*I1*I2*I3*~I4)),LIBVER=2.0.0
160  PIN, I0, I, AL<2>,,
161  PIN, I1, I, AL<3>,,
162  PIN, I2, I, n2644,,
163  PIN, I3, I, n2800,,
164  PIN, I4, I, n2938,,
165  PIN, O, O, XMPLR_NET_104, 1.129999,
166  END
167  SYM, EQN5_XMPLR_NET_110, EQN,EQN=((I0*I1*I2*I3*I4)),LIBVER=2.0.0
168  PIN, I0, I, AL<6>,,
169  PIN, I1, I, AL<7>,,
170  PIN, I2, I, AH<1>,,
171  PIN, I3, I, n2798,,
172  PIN, I4, I, n2937,,
173  PIN, O, O, XMPLR_NET_110, 1.129999,
174  END
175  SYM, i3592, EQN,EQN=((~I0*I1)),LIBVER=2.0.0
176  PIN, I0, I, AH<0>,,
177  PIN, I1, I, n2635,,
178  PIN, O, O, n2937, 0.509999,
179  END
180  SYM, i3595, EQN,EQN=((~I0)+(~I1)),LIBVER=2.0.0
181  PIN, I0, I, AL<0>,,
182  PIN, I1, I, AL<1>,,
183  PIN, O, O, n2938, 0.509999,
184  END
185  SYM, EQN5_XMPLR_NET_120, EQN,EQN=((I4)+(~I1*I2)+(~I0*I2*I3)),LIBVER=2.0.0
186  PIN, I0, I, AL<2>,,
187  PIN, I1, I, AL<3>,,
188  PIN, I2, I, n2800,,
189  PIN, I3, I, n2938,,
190  PIN, I4, I, n2943,,
191  PIN, O, O, XMPLR_NET_120, 1.129999,
192  END
193  SYM, i3607, EQN,EQN=((I3)+(~I2*I4)+(~I0*~I1*I4)),LIBVER=2.0.0
194  PIN, I0, I, AL<5>,,
195  PIN, I1, I, AL<6>,,
196  PIN, I2, I, AL<7>,,
197  PIN, I3, I, n2831,,
198  PIN, I4, I, n2937,,
199  PIN, O, O, n2943, 1.129999,
200  END
201  EOF
```

FIG. 12 (cont.)

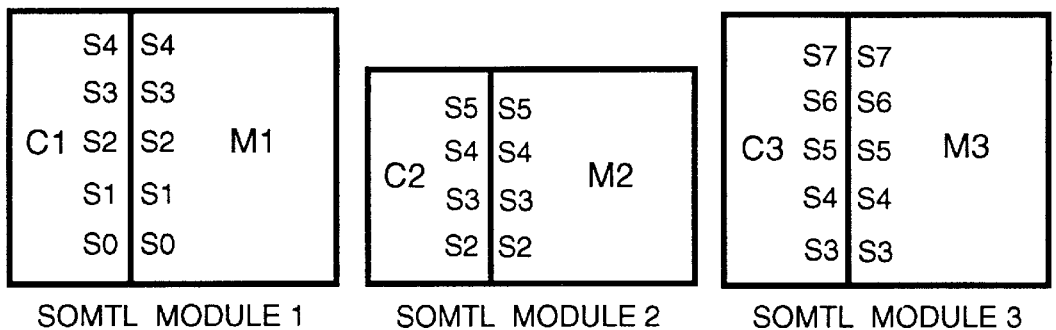
FIG. 14A (UNPACKED)
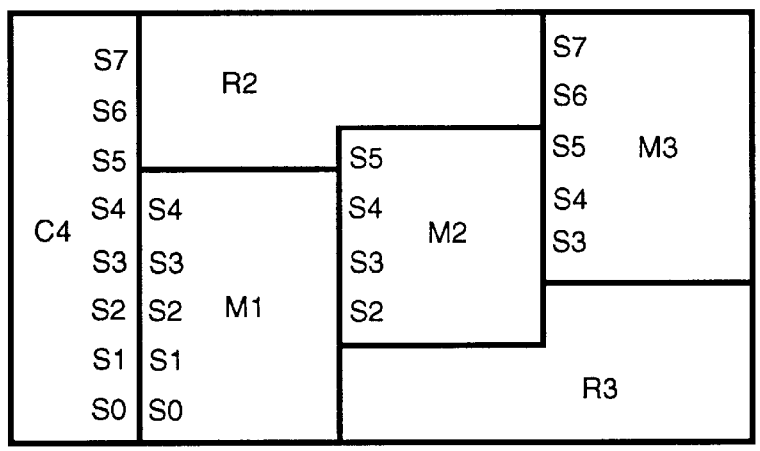
FIG. 14B (K=8)
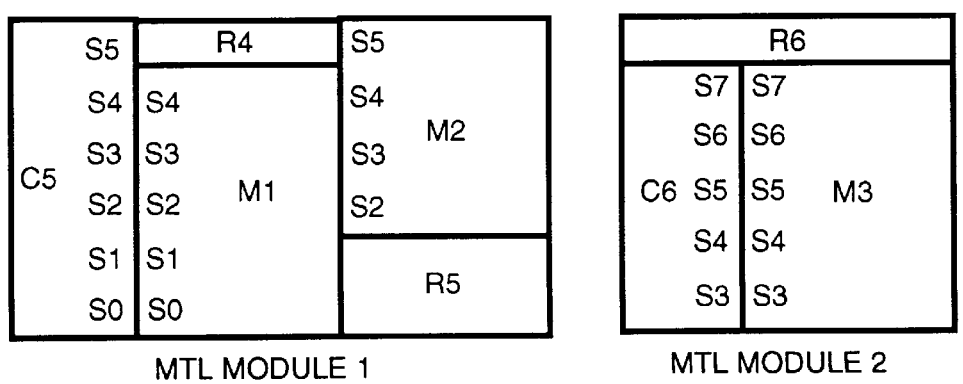
FIG. 14C (K=6)

Packing information for F=5, K=6, R=20

Module MTL 0
+i3567
+i3595
+i3592
+i3577
END

Module MTL 1
+EQN3_XMPLR_NET_118
+EQN4_XMPLR_NET_116
+EQN5_XMPLR_NET_114
+i3558
+EQN4_XMPLR_NET_112
END Module MTL 2
+i3571
+EQN4_XMPLR_NET_108
+i3607
END Module MTL 3
+EQN4_XMPLR_NET_106
+EQN5_XMPLR_NET_104
+EQN5_XMPLR_NET_120
END Module MTL 4
+i3563
+EQN5_XMPLR_NET_110
END

FIG. 15

Packed modules F=5, K=6, R=20

- Control inputs on top row IC00-IC05
- Outputs on top row O0-On
- Pass inputs first column IP01-IPm
- XT => gate connected to true control input
- XB => gate connected to bar control input
- "*" => indicates product terms connected to output
- " " => blank space is a horizontal connection

MODULE MTL0

|    | IC00 | IC01 | IC02 | IC03 | IC04 | IC05 | O0 | O1 | O2 | O3 |
|----|------|------|------|------|------|------|----|----|----|----|
| 1  | VDD  | XB   |      |      |      |      | *  |    |    |    |
| 2  | VDD  |      | XB   |      |      |      | *  |    |    |    |
| 3  | IP01 | XT   | XT   |      |      |      | *  |    |    |    |
| 4  | VSS  |      | XB   |      |      |      |    | *  |    |    |
| 5  | IP03 |      | XT   |      |      |      |    | *  |    |    |
| 6  | VDD  |      |      | XB   |      |      |    |    | *  |    |
| 7  | IP05 |      |      | XT   |      |      |    |    | *  |    |
| 8  | VSS  |      |      | XT   | XB   |      |    |    |    | *  |
| 9  | IP08 |      |      | XB   | XB   |      |    |    |    | *  |
| 10 | IP08 |      |      |      | XB   | XT   |    |    |    | *  |
| 11 | IP10 |      |      | XB   | XT   |      |    |    |    | *  |
| 12 | IP10 |      |      |      | XT   | XT   |    |    |    | *  |

FIG. 16

MODULE MTL1

| | IC00 | IC01 | IC02 | IC03 | IC04 | IC05 | O0 | O1 | O2 | O3 | O4 |
|---|---|---|---|---|---|---|---|---|---|---|---|
| 1 | VDD | XB | | | | | * | | | | |
| 2 | VDD | | XB | | | | * | | | | |
| 3 | IP01 | XT | XT | | | | * | | | | |
| 4 | VDD | XT | | | | | | * | | | |
| 5 | VDD | | XB | | | | | * | | | |
| 6 | VDD | | | XB | | | | * | | | |
| 7 | IP03 | XB | XT | XT | | | | * | | | |
| 8 | VDD | XT | | | | | | | * | | |
| 9 | VDD | | XB | | | | | | * | | |
| 10 | VDD | | | XT | | | | | * | | |
| 11 | VDD | | | | XB | | | | * | | |
| 12 | IP05 | XB | XT | XB | XT | | | | * | | |
| 13 | VDD | XT | | | | | | | | * | |
| 14 | VDD | | | XT | | | | | | * | |
| 15 | VDD | | | | XT | | | | | * | |
| 16 | IP07 | XB | | XB | XB | | | | | * | |
| 17 | VDD | XB | | | | | | | | | * |
| 18 | VDD | | | | XB | | | | | | * |
| 19 | VDD | | | | | XB | | | | | * |
| 20 | IP09 | | XT | | XT | XT | | | | | * |

MODULE MTL2

| | IC00 | IC01 | IC02 | IC03 | IC04 | IC05 | O0 | O1 | O2 |
|---|---|---|---|---|---|---|---|---|---|
| 1 | VDD | XT | | | | | * | | |
| 2 | VDD | | XB | | | | * | | |
| 3 | IP01 | XB | XT | | | | * | | |
| 4 | VDD | XT | | | | | | * | |
| 5 | VDD | | XB | | | | | * | |
| 6 | VDD | | | XB | | | | * | |
| 7 | P03 | XB | XT | XT | | | | * | |
| 8 | VSS | | | XT | | | | | * |
| 9 | IP06 | | XB | | | | | | * |
| 10 | IP06 | XT | | | XT | | | | * |
| 11 | IP07 | | | XB | XB | | | | * |
| 12 | IP08 | XB | XT | XB | XT | | | | * |

FIG. 16 (cont.)

MODULE MTL3

| | IC00 | IC01 | IC02 | IC03 | IC04 | IC05 | O0 | O1 | O2 |
|---|---|---|---|---|---|---|---|---|---|
| 1 | VDD | XB | | | | | * | | |
| 2 | VDD | | XB | | | | * | | |
| 3 | VDD | | | XB | | | * | | |
| 4 | IP01 | XT | XT | XT | | | * | | |
| 5 | VDD | XB | | | | | | * | |
| 6 | VDD | | XB | | | | | * | |
| 7 | VDD | | | XB | | | | * | |
| 8 | VDD | | | | XT | | | * | |
| 9 | IP03 | XT | XT | XT | XB | | | * | |
| 10 | VSS | | | | XT | | | | * |
| 11 | IP06 | | XB | | | | | | * |
| 12 | IP06 | XT | | XB | | | | | * |
| 13 | IP07 | XB | | | XB | | | | * |
| 14 | IP08 | XT | | XT | XB | | | | * |

MODULE MTL4

| | IC00 | IC01 | IC02 | IC03 | IC04 | IC05 | O0 | O1 |
|---|---|---|---|---|---|---|---|---|
| 1 | VDD | XB | | | | | * | |
| 2 | VDD | | XB | | | | * | |
| 3 | VDD | | | XB | | | * | |
| 4 | IP01 | XT | XT | XT | | | * | |
| 5 | VDD | XB | | | | | | * |
| 6 | VDD | | XB | | | | | * |
| 7 | VDD | | | XB | | | | * |
| 8 | VDD | | | | XB | | | * |
| 9 | IP03 | XT | XT | XT | XT | | | * |

FIG. 16 (cont.)

Verilog netlist

```
1  module memmap(BE, A, B, C, D, E, F, G, H, AH_0_, AH_1_, AH_2_, AH_3_, AH_4_,
2  AH_5_, AH_6_, AH_7_, AL_0_, AL_1_, AL_2_, AL_3_, AL_4_, AL_5_, AL_6_,
3  AL_7_, AS, RST, CLK);
4  output BE, A, B, C, D, E, F, G, H;
5  input AH_0_, AH_1_, AH_2_, AH_3_, AH_4_, AH_5_, AH_6_, AH_7_, AL_0_,
6  AL_1_, AL_2_, AL_3_, AL_4_, AL_5_, AL_6_, AL_7_, AS, RST, CLK;
7  FDC XMPLR_INST_129(BE, XMPLR_NET_120, CLK, RST);
8  FDC XMPLR_INST_137(H, XMPLR_NET_104, CLK, RST);
9  FDC XMPLR_INST_145(G, XMPLR_NET_106, CLK, RST);
10 FDC XMPLR_INST_153(F, XMPLR_NET_108, CLK, RST);
11 FDC XMPLR_INST_161(E, XMPLR_NET_110, CLK, RST);
12 FDC XMPLR_INST_169(D, XMPLR_NET_112, CLK, RST);
13 FDC XMPLR_INST_177(C, XMPLR_NET_114, CLK, RST);
14 FDC XMPLR_INST_185(B, XMPLR_NET_116, CLK, RST);
15 FDC XMPLR_INST_193(A, XMPLR_NET_118, CLK, RST);
16 INV2 PINV00(VIRNET_0, AS);
17 INV2 PINV01(VIRNET_1, AS);
18 INV2 PINV02(VIRNET_2, AS);
19 INV2 PINV03(VIRNET_3, AH_0_);
20 INV2 PINV04(VIRNET_4, AL_4_);
21 INV2 PINV05(VIRNET_5, AL_2_);
22 INV2 PINV06(VIRNET_6, AS);
23 INV1 PINV07(VIRNET_7, AL_5_);
24 INV2 PINV08(VIRNET_8, AH_5_);
25 INV2 PINV09(VIRNET_9, BE);
26 INV1 PINV10(VIRNET_10, AL_6_);
27 INV2 PINV11(VIRNET_11, n2943);
28 INV2 PINV12(VIRNET_12, n2800);
29 INV2 PINV13(VIRNET_13, n2831);
30 INV2 PINV14(VIRNET_14, n2937);
31 MTL0 MTL0(n2798, n2938, n2937, n2831, AH_6_, AH_7_, AL_1_, n2635, AS,
32 AH_1_, VIRNET_8, AL_0_, AH_0_, VIRNET_9, n2798);
33 MTL1 MTL1(XMPLR_NET_118, XMPLR_NET_116, XMPLR_NET_114, n2635,
34 XMPLR_NET_112, AH_4_, n2798, AH_3_, AH_2_, AH_1_, n2635, VIRNET_0,
35 VIRNET_1, VIRNET_2, VIRNET_6, VIRNET_3);
36 MTL2 MTL2(n2800, XMPLR_NET_108, n2943, AL_6_, n2937, n2644, n2831, AL_7_,
37 AL_4_, VIRNET_4, VIRNET_13, VIRNET_14, AL_5_);
38 MTL3 MTL3(XMPLR_NET_106, XMPLR_NET_104, XMPLR_NET_120, AL_3_,
39 n2644, n2800, n2938, n2943, VIRNET_5, AL_2_, VIRNET_11, VIRNET_12, AL_2_);
40 MTL4 MTL4(n2644, XMPLR_NET_110, AL_7_, AH_1_, n2798, n2937, VIRNET_7,
41 VIRNET_10);
42 endmodule
```

FIG. 18

Verilog netlist (cont.)

43 module MTL0(O0, O1, O2, O3, IC00, IC01, IC02, IC03, IC04, IC05, IP01, IP03, IP05,
44 IP08, IP10);
45 output O0, O1, O2, O3;
46 input IC00, IC01, IC02, IC03, IC04, IC05, IP01, IP03, IP05, IP08, IP10;
47 endmodule 48 module MTL1(O0, O1, O2, O3, O4, IC00, IC01, IC02, IC03, IC04, IC05, IP01, IP03,
49 IP05, IP07, IP09);
50 output O0, O1, O2, O3, O4;
51 input IC00, IC01, IC02, IC03, IC04, IC05, IP01, IP03, IP05, IP07, IP09;
52 endmodule 53 module MTL2(O0, O1, O2, IC00, IC01, IC02, IC03, IC04, IP01, IP03, IP06, IP07,
54 IP08);
55 output O0, O1, O2;
56 input IC00, IC01, IC02, IC03, IC04, IP01, IP03, IP06, IP07, IP08;
57 endmodule 58 module MTL3(O0, O1, O2, IC00, IC01, IC02, IC03, IC04, IP01, IP03, IP06, IP07,
59 IP08);
60 output O0, O1, O2;
61 input IC00, IC01, IC02, IC03, IC04, IP01, IP03, IP06, IP07, IP08;
62 endmodule 63 module MTL4(O0, O1, IC00, IC01, IC02, IC03, IP01, IP03);
64 output O0, O1;
65 input IC00, IC01, IC02, IC03, IP01, IP03;
66 endmodule

FIG. 18 (cont.)

Packer algorithm

Inputs:
- S0 - The set of Single Output MTL Modules (SOMTLM).
- R - The maximum number of rows in set S2.
- K - The maximum number of control inputs in set S2.

Output:
- S2 - Final set of packed MTL modules.

Variables:
- S1 - The current set of SOMTLMs selected for packing.
- r - The current total number of rows in set S1.
- k - The current total number of different control input pins in set S1.

---

Step 0:
* If there is no SOMTLM in set S0, then STOP: packing is done;

Step 1:
* Clear set S1, and reset r=0, k=0;

Step 2:
* For every SOMTLM in set S0, calculate:
$$D = D1 - D0$$
where,
- D0 is the number of different control input pins removed from set S0 if the SOMTLM is moved to set S1;
- D1 is the number of different control input pins added to set S1 if the SOMTLM is moved to set S1;

Step 3:
* From set S0 select the SOMTLM which:
  (1) has the smallest D, and
  (2) satisfies: $r+r_i \leq R$ ; $k+D1 \leq K$
  Where, $r_i$ is the number of rows in the SOMTLM being tested.
  With condition (2) met, if two or more SOMTLMs yield the same smallest value D, choose any one of the two or more SOMTLMs;
* If one or both conditions are not met, GOTO Step4;
* If a SOMTLM meets both conditions, move it from set S0 to set S1, and update r & k as follows:
$$r=r+r_i \quad , \quad k=k+D1 \;$$
* GOTO Step2;

Step 4:
* If set S1 is empty, then STOP: packing is impossible;
* Otherwise pack all SOMTLMs of set S1 into set S2;
* GOTO Step0;

FIG. 22

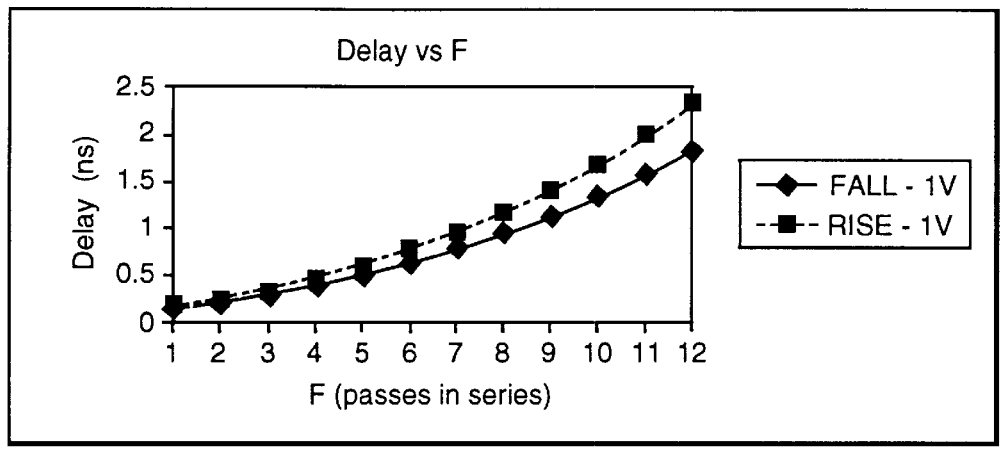
FIG. 23
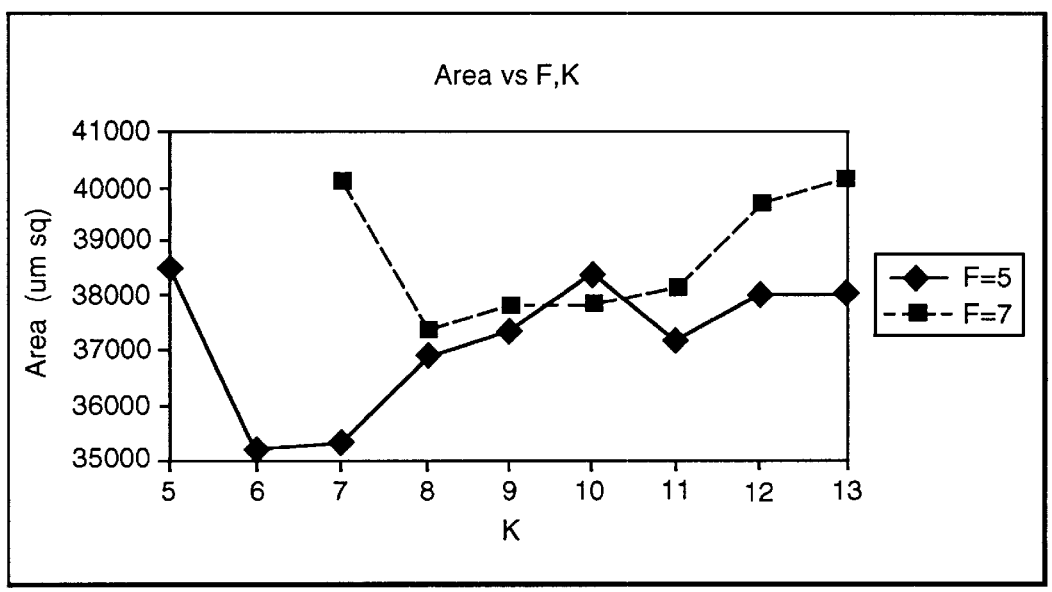
FIG. 24
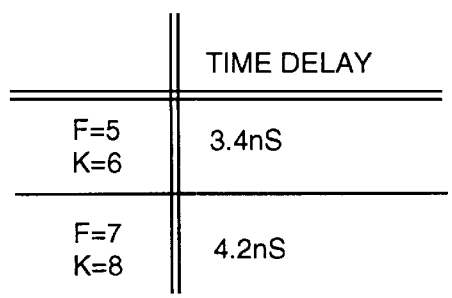
TABLE 2

MODULE-BASED LOGIC ARCHITECTURE AND DESIGN FLOW FOR VLSI IMPLEMENTATION

FIELD OF THE INVENTION

The present invention relates to design methodologies for VLSI, and particularly to a module-based architecture and design flow which enable efficient and automated implementation of VLSI logic circuits.

BACKGROUND

Logic networks using MOS technology are often formed with NAND gates, NOR gates and Inverter gates since these structures are easily implemented. A standard cell is simply a digital logic element made up of such gates. The standard cell performs a specified function and is laid out in a predefined fashion. A number of such cells are pre-laid out and made available in a library. FIG. 1 shows the circuit schematic of one such cell (a 2-input NAND gate) in CMOS technology. Using the standard cells in the library, a design is captured via schematic capture or Hardware Description Language HDL). Then through a delay versus area analysis, the overall logic implementation is optimized. The layout is then automatically placed and routed by CAD software. The layout is usually identifiable as rows of constant height blocks separated by rows of routing, as shown in FIG. 2.

The standard cell approach however, suffers from certain drawbacks:

(1) Power consumption: with every gate transition, power is consumed in charging or discharging the capacitive load at the output node of the gate. Every gate that makes a transition also draws crow-bar current (current drawn from the power supply terminal and into the ground terminal for a given period of time) which increases the overall power consumption. These two types of power consumption are commonly referred to as dynamic power consumption. Depending upon the size of transistors, capacitive loading at output nodes and the size of the particular circuit, dynamic power consumption may be quite large.

(2) Gate capacitance: because of the high capacitance associated with the gates of PMOS and NMOS transistors, and the requirement of PMOS to NMOS transistor size ratio of 2 to 1 in gate design, CMOS gates typically have large input capacitance and consume large portions of silicon area. The large input capacitance hinders propagation delays, and at times requires a buffering scheme wherein a chain of gates are needed to effectively drive a given node.

(3) Multiple gate levels: implementing complex gates using the standard cell library approach typically requires multiple levels of logic gates, which adversely impacts area and power consumption as well as propagation delays.

(4) Large cell library: the standard cell approach requires a library of cells which, depending upon the types of designs intended, may require a large number of cells. Every cell in the library needs to be designed and characterized, and as such development of large cell libraries are quite costly. Transferring cell libraries across generations of technology is also quite costly since redesign and recharacterization of all the cells are often required.

(5) Inefficient synthesis: the standard cell approach is not synthesis efficient for a number of reasons. First, synthesis tools lack the sophistication needed to achieve optimal area in all cases. For example, in mapping a complex equation, a portion of which may efficiently be mapped into a complex cell, the synthesis tools are often incapable of recognizing such opportunities. Instead, the complex equation is inefficiently mapped into an excessive number of cells. Second, every cell library has a finite number of cells, and is designed for a particular size design. For example, for implementation of complex VLSI designs a larger cell library is needed as compared to simpler SSI designs. Within each area of design however, the cell library provides only a limited set of cells, which can at times lead to inefficient implementation of a design, e.g. two or more cells used where a single more compact cell could be used. Third, for larger cell libraries, due to the large number of cells that need to be analyzed, the compute time in implementing any logic function is quite long.

(6) Low granularity: the cells in the cell library are typically 2 to 6-input single-output logic gates. To implement large logic functions using such cells, requires a significant number of cells, which results in more logic stages and a significant number of interconnections and buffering.

(7) Interconnect delay: the performance of a design based on the standard cell approach is typically limited by the interconnect propagation delays. This is due to the large number of interconnections caused by the low granularity of the standard cells, as well as the fact that no particular structure is provided for the place and route tool in routing such critical signals as Clock and Scan.

The pass transistor is another common MOS structure, which over the years has gained significant popularity as another means of implementing logic gates. This has led to the development of what is known in the art as the Pass Transistor Logic (PTL) technology (see the textbook by C. A. Mead and L. A. Conway, Introduction to VLSI Systems, Reading, Mass.: Addison Wesley, 1980.

The PTL approach possesses a number of beneficial characteristics making it a more attractive approach than the conventional CMOS logic gate approach. The PTL approach maximizes the regularity of the resulting logic circuitry, and results in significant topological, power and speed advantages over the classical logic design methods. First, the pass transistor dissipates no significant steady state power. Second, arrays of pass transistors form structures of regular topology, often consuming less area for a given logical function than equivalent conventional logic gates. Third, combinational logic formed with pass transistors often reduces the signal propagation delay through a network.

One disadvantage of the PTL approach is that the voltage level of the logic high signal is degraded due to the characteristics of the field effect transistor used as a pass transistor. However, this can be overcome by simple signal-restoring techniques (see the article by Alex Shubat et. al., Differential Pass Transistor Logic in CMOS Technology, Electronics Letters 13, Vol. 22 No. 6, PP. 294–295, March 1986). Also, after passing a logic high level through one pass transistor, no significant further degradation of the high voltage level occurs when the signal is passed through additional pass transistors, assuming no pass transistor control gate is driven by the output of another pass transistor.

The use of the PTL approach has generally been limited to implementation of relatively small logic circuits, such as the priority encoder circuit disclosed in U.S. Pat. No. 4,622,648 to S. R. Whitaker, or the adder circuit in U.S. Pat. No. 5,148,387 patent to K. Yano et. al. The PTL approach has also been used to implement the cells for a standard cell library as disclosed in the article by K. Yano et. al., Top-Down Pass-Transistor Logic Design, IEEE JSSC vol. 31, no. 5, June 1996. Although the approach disclosed in the K. Yano et. al. article exploits some of the basic advantages of the PTL technology, Yano's approach suffers from the same general drawbacks associated with the conventional standard cell library approach described above.

The advantages of the PTL approach have not been fully exploited in implementation of large scale logic circuits primarily due to lack of a design methodology in which the PTL technology could be integrated in an efficient and automated fashion.

SUMMARY

A new design methodology which utilizes a module-based architecture is used to implement customized VLSI designs. In accordance with this invention, the module-based architecture comprises a number of Matrix Transistor Logic (MTL) modules, each MTL module having a control input buffer section, an output stage section, and a matrix array section which implements logic functions using Pass Transistor Logic technology. VLSI circuits consuming minimal silicon area with superior power consumption and time delay characteristics are implemented through:

(i) sharing of resources such as the control input buffer section;

(ii) an efficient integration of the Pass Transistor Logic technology into each MTL module; and (iii) use of three variables in a highly automated design procedure wherein each variable places a different constraint on the MTL modules.

The module-based architecture includes a number of Matrix Transistor Logic (MTL) modules placed in one or more rows, wherein each MTL module includes:

(1) A control input buffer section which has a number of input terminals for receiving control input signals, and a number of output terminals for providing the true and complement signals of the control input signals;

(2) An output stage section which has a number of input terminals and a number of output terminals;

(3) A matrix array section, which implements logic functions using Pass Transistor Logic technology. The matrix array section is made up of a number of pass-groups, wherein each pass-group includes a number of rows of pass transistors. In each pass-group one end of the rows receive a set of pass input signals via a first set of input terminals, and the other end of the rows is shorted together and connected to one of the input terminals of the output stage section. The gate terminals of the pass transistors in the pass-groups receive the true and complement signals of the control input signals from the control input buffer section.

The control input buffer section is abutted to the matrix array section along a first dimension of the matrix array section. The output stage section is abutted to the matrix array section along a second dimension opposite the first set of input terminals.

Three variables are used in an automated design procedure to implement the MTL modules. The first variable represents the number of control input signals for each MTL module. A target value selected for the first variable is allowed to vary for each individual MTL module within a limit primarily dictated by the capabilities of the place and route tool used in assembling the design. Accordingly, the first variable limits the size of the first dimension for all the MTL modules to a relatively small range of sizes. The second variable limits the second dimension to a specific maximum size for all the MTL modules. The third variable represents the maximum number of serially-connected pass transistors in the matrix array section of the MTL modules. Specific values are selected for the three variables based on power consumption, silicon area consumption and time delay considerations.

In one embodiment of the invention, a number of circuit blocks are placed in another row parallel to the one or more rows of MTL modules. Each circuit block has a first dimension and a second dimension, the first dimension being fixed to the same size for all the circuit blocks. The circuit blocks may include any of the following circuits:

(i) A pass input buffer section which receives pass input signals and provides true and complement signals of the pass input signals, wherein the true and complement signals are received by the first set of input terminals of the matrix array section;

(ii) A driver circuit, wherein the strength of the driver circuit is adjusted based on the capacitive load driven by the driver circuit; and (iii) Any synchronous circuits such as flip-flop registers and latch circuits.

The MTL modules and the circuit blocks are placed and interconnected using a place and route program.

The pass-groups in the matrix arrays are selected from a collection of pass-groups. Each pass-group in the collection corresponds to one of a number of boolean expressions, wherein the boolean expressions represent the design to be implemented. Each pass group in the collection receives control input signals and pass input signals, wherein each control input signal corresponds to one literal in the boolean expression. Within the limitations provided by the first and second variables, pass-groups with the most number of common control input signals are placed together in one MTL module.

In implementing a logic function, the logic function may be partitioned into a number of logic blocks, wherein target values for the three variables are arrived at for each logic block independently. Logic functions of any degree of complexity or size are. implemented using the above described MTL modules and circuit blocks via automated design procedures.

The method for implementing VLSI designs using the above module-based architecture includes the following steps:

(a) The design is entered using a design entry tool.

(b) Using a synthesis program, a number of optimized boolean expressions and sequential elements are generated from the entered design. Prior to execution of the synthesis program, the synthesis program is provided a value for the third variable described above. The synthesis program uses a synthesis library in generating the boolean expressions. The synthesis library includes basic primitives which are function-independent.

(c) The boolean expressions are mapped into a circuit of single-output Matrix Transistor Logic (MTL) modules. Each single-output MTL module implements one boolean expression using Pass Transistor Logic technology. Each single-output MTL module receives control input signals corresponding to the literals in each boolean expression;

(d) Using a packing algorithm, the single-output MTL modules are packed into a number of multiple-output MTL modules. The packing algorithm receives a value for each of the first and second variables described above. The execution of the packing algorithm results in placing single-output MTL modules with the most number of common control input signals together in one multiple-output MTL module within the limitations provided by the first and second variables;

(e) Using an algorithm, the layout representation of each of the multiple-output MTL modules is constructed. The algorithm selects appropriate layout primitives from a library which includes a set of basic layout primitives; and (f) The multiple-output MTL modules are placed and interconnected using a place and route program.

One feature of the present invention is that it enables the use of the Pass Transistor Logic (PTL) technology in an efficient manner, and as such fully exploits the power consumption, propagation delay, and area consumption advantages inherent in PTL technology.

Another feature of the present invention is the low power consumption, improved propagation delays and improved area consumption due to the enhanced routings brought about by the highly structured module-based architecture.

Another feature of the present invention is that complex gates can be implemented in a single MTL module in a simple fashion.

Another feature of the present invention is that it is synthesis efficient because of the synthesis library containing a small number of function-independent cells.

Another feature of the present invention is that due to the small number of layout primitives in the tile library (which are used to implement the physical layout of the MTL modules), the architecture and the design methodology of the present invention can be transported across technologies with ease.

These and other features and advantages of the present invention will become more apparent from the following description and the accompanying drawings.

Figure 9:
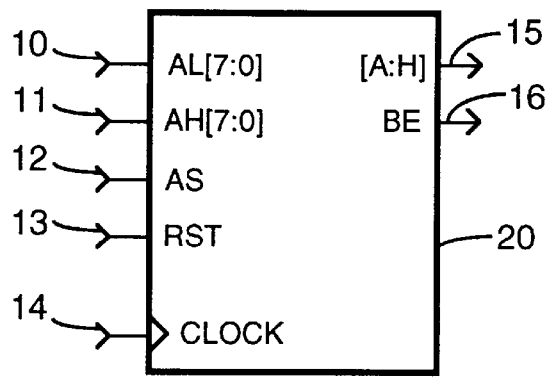
FIG. 9 shows a pin diagram of a memory map circuit to be implemented in accordance with the architecture and design methodology of the present invention.

Table 1 shows the truth table of the memory map circuit of FIG. 9.

FIG. 10 shows the Verilog-HDL description of the memory map circuit in accordance with Table 1.

FIG. 11 outlines the basic primitives in the synthesis library.

FIG. 12 shows the intermediate file which contains a series of boolean equations corresponding to the truth table of Table 1.

Figure 13:
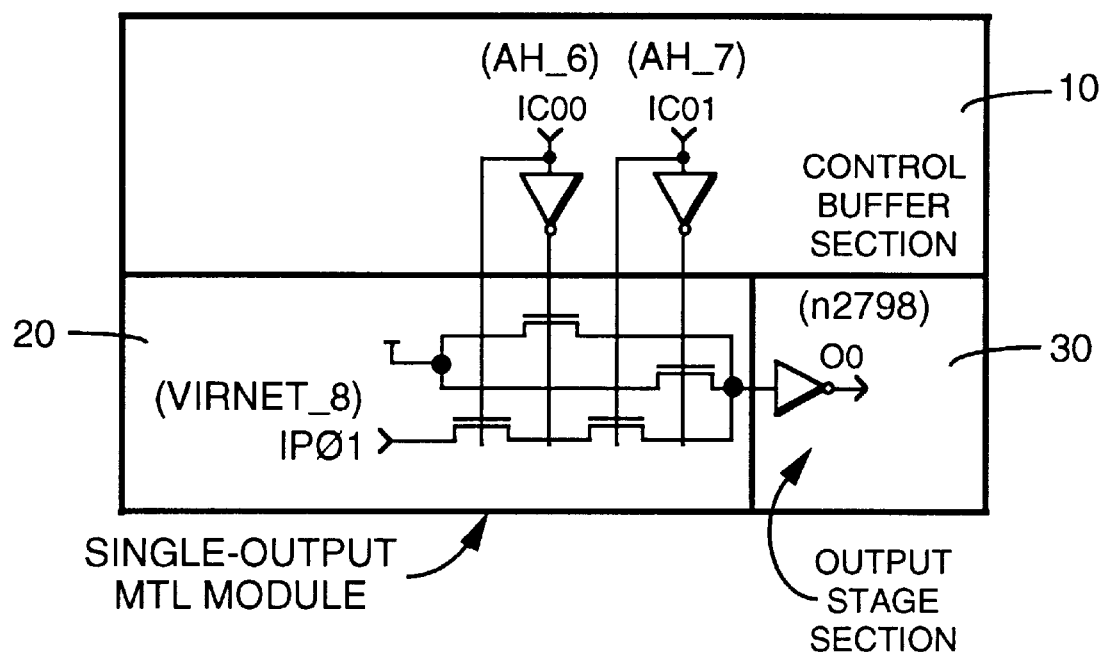

FIG. 13 shows the single-output MTL module implementation of the equation represented by lines 139 through 144 in FIG. 12.

FIGS. 14A, 14B and 14C illustrate two methods of packing single-output MTL modules into one or more multiple-output MTL module.

FIG. 15 outlines five multi-output MTL modules which are the outcome of executing the packer algorithm in FIG. 22 on the single-output MTL modules corresponding to the boolean expressions in FIG. 12, with R and K values set to 20 and 6, respectively.

FIG. 16 shows the five MTL modules of FIG. 15 in an expanded format.

Figure 17:
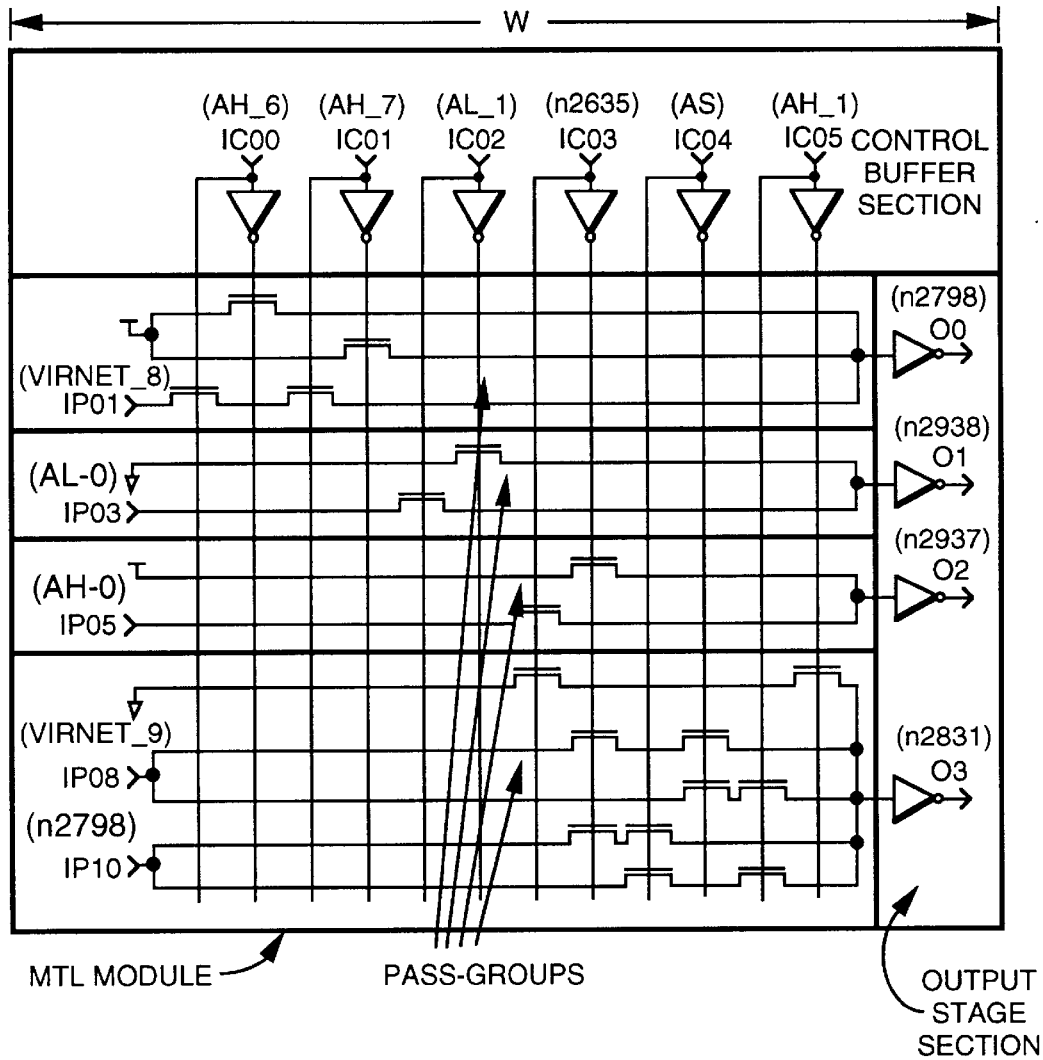

FIG. 17 shows the exact circuit implementation of the MTL0 module of FIG. 16.

FIG. 18 provides a Verilog netlist which enables one to determine the pin assignments made by the Pasgen program.

Figures 19, 19A:
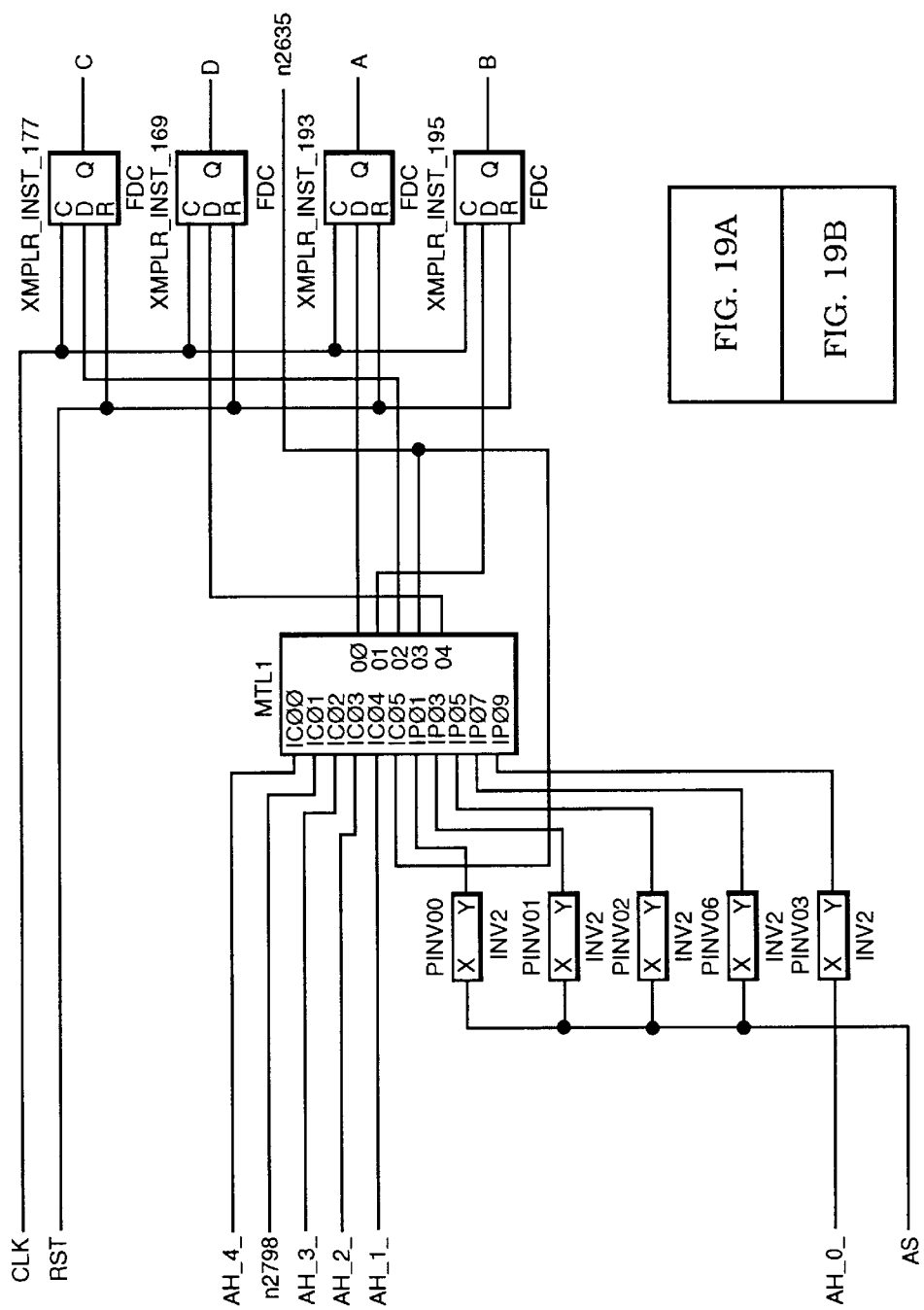
Figure 19B:
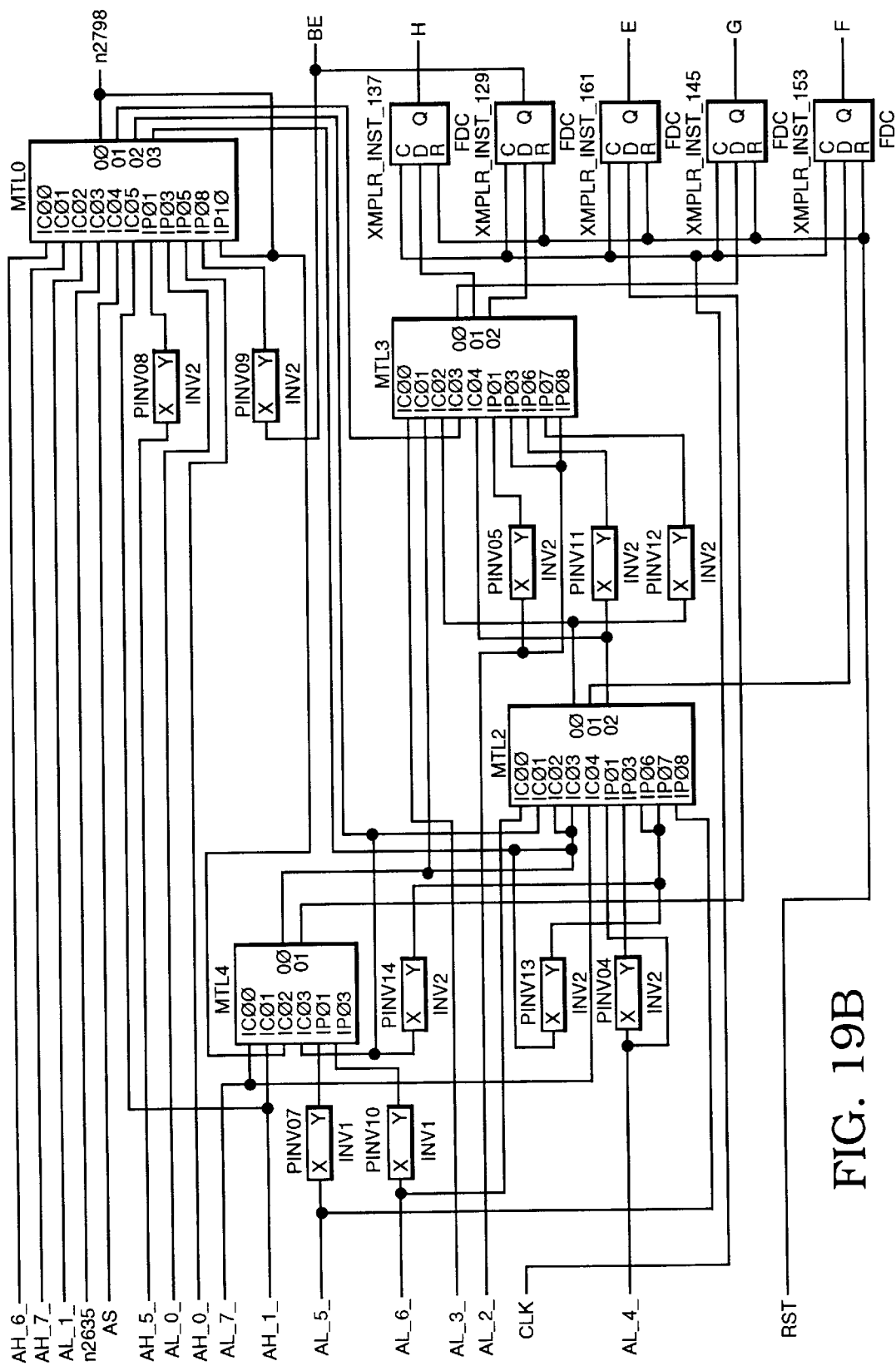

FIG. 19 shows the schematic block diagram of the memory map circuit.

Figure 20:
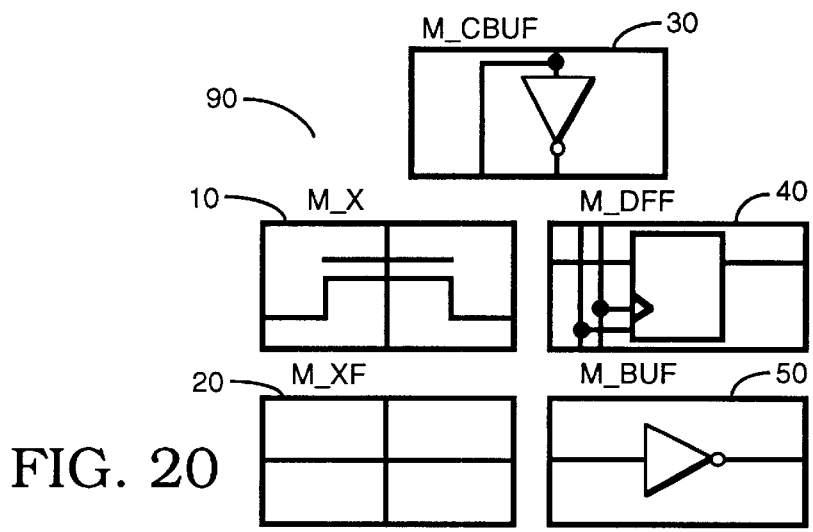

FIG. 20 illustrates a typical tile library consisting of five tile circuits.

Figure 21:
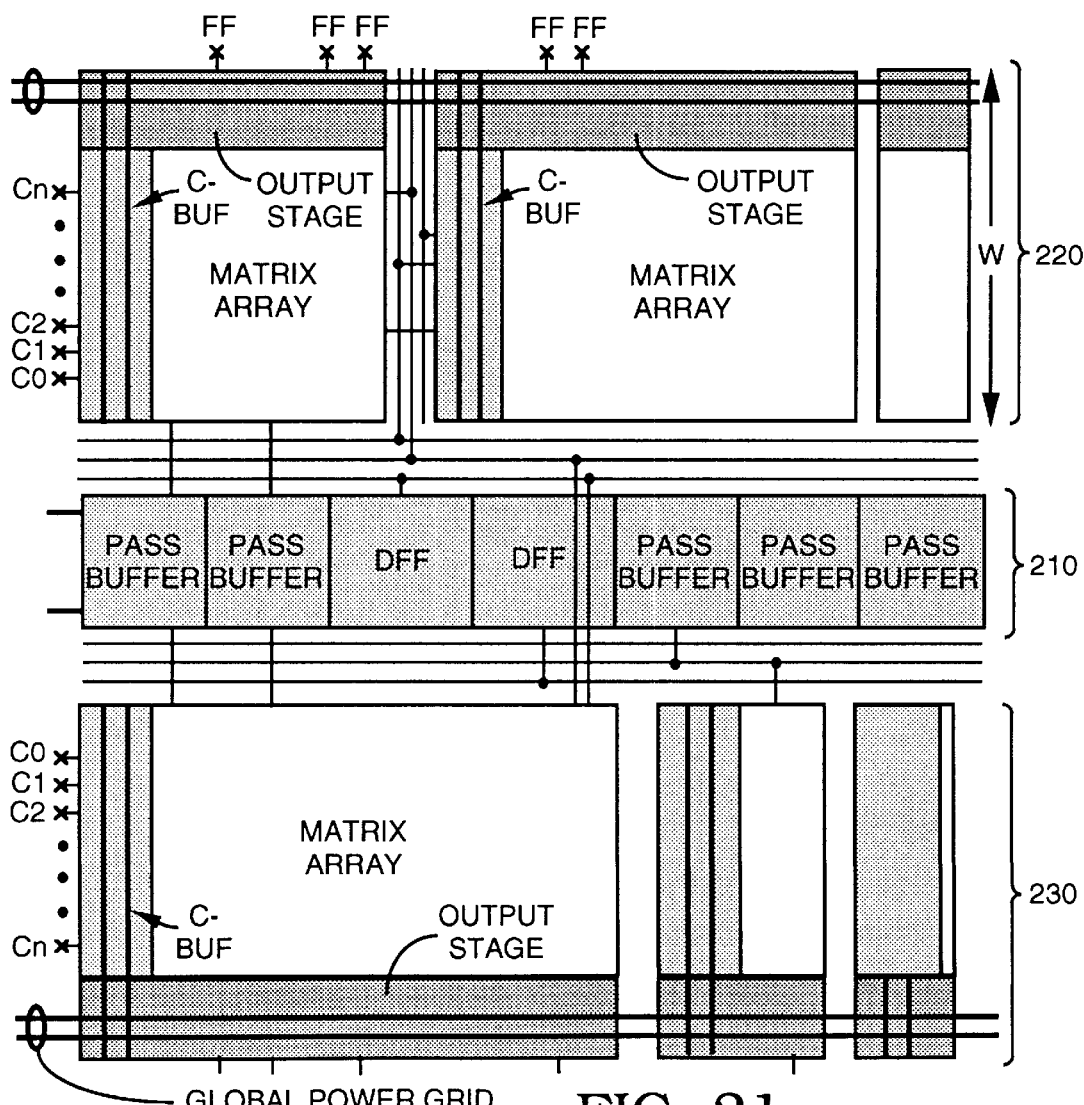

FIG. 21 shows the outcome of executing the place and route program on the tiled MTL modules, and also shows one of few approaches in arranging the MTL modules and other circuit blocks.

FIG. 22 shows the packer algorithm.

FIG. 23 shows a graph in which the simulation results of the rising as well as the falling time delays through chains of different number pass transistors, in a 0.5 $\mu$m process technology, is plotted.

FIG. 24 shows a graph of the total area versus the variable K for two different values of F.

Table 2 shows the simulation results for the two optimum F and K values in FIG. 24.

Figure 25:
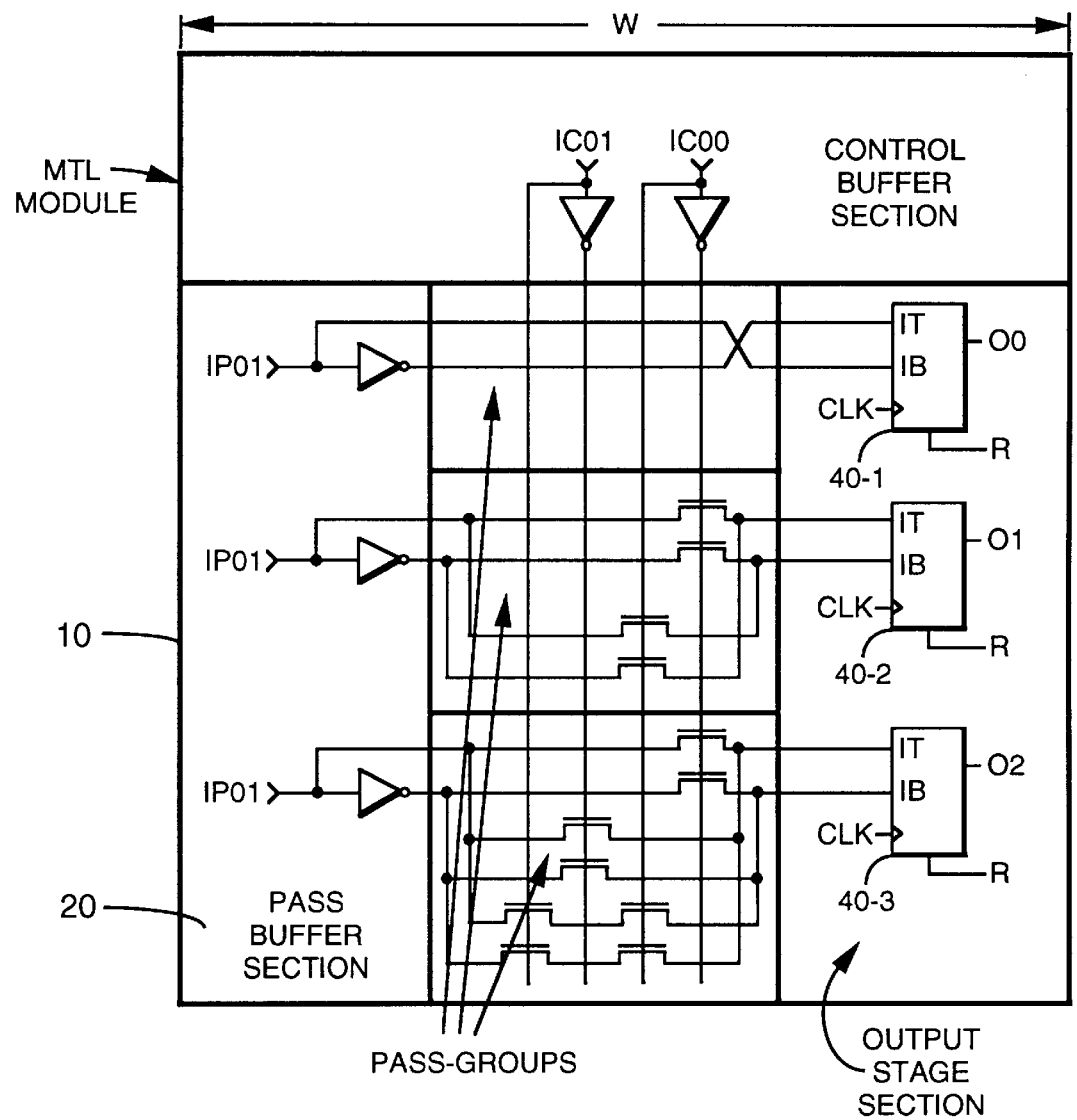

FIG. 25 shows one embodiment of an MTL module in which (1) the flip-flop registers and the pass input buffers are included within the MTL module, and (2) Differential Pass Transistor Logic approach is used in implementing the pass-group sections.

Figure 26:
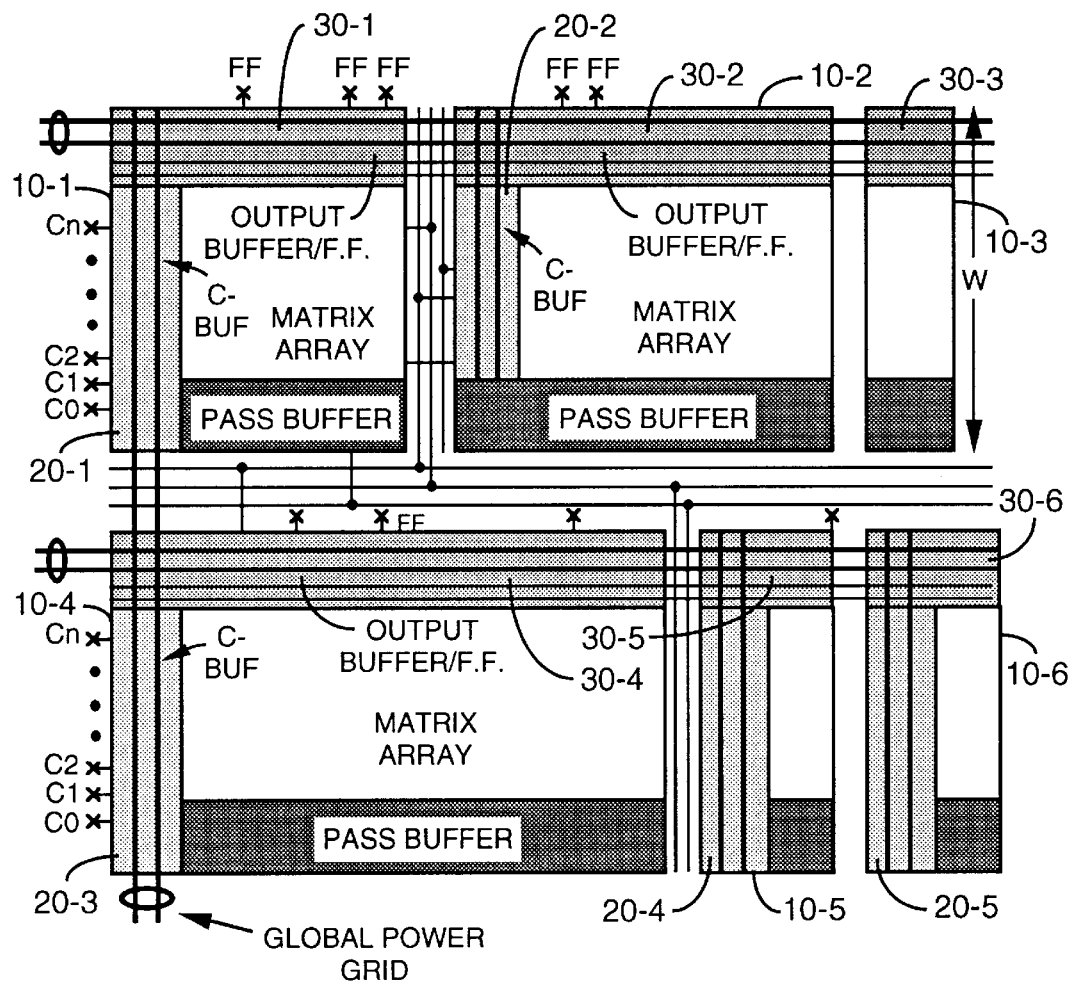

FIG. 26 shows another approach in arranging the MTL modules—the pass input buffers and the flip-flop registers are incorporated in the MTL modules.

Figure 8:
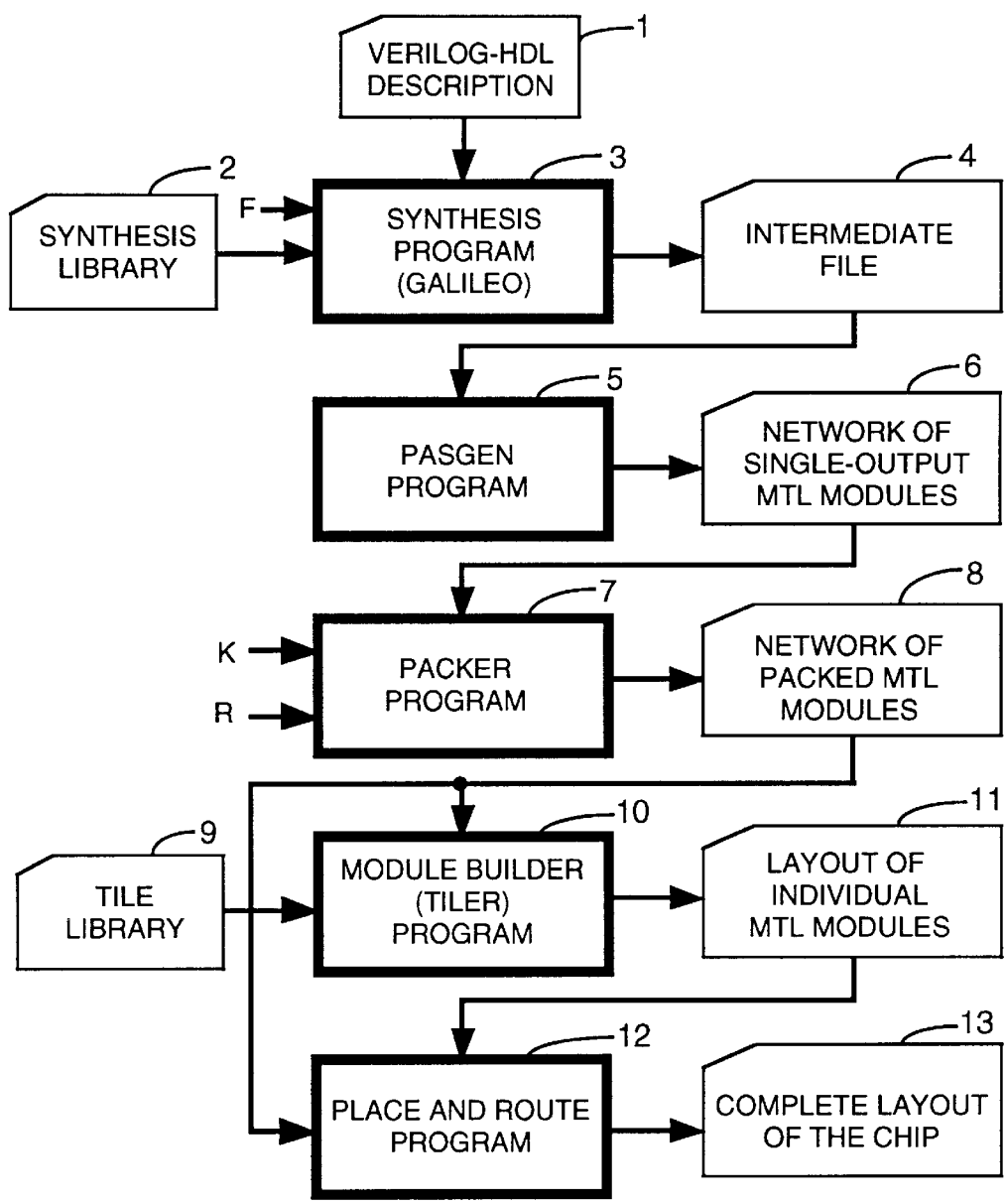
FIG. 8 shows the design flow in accordance with the present invention.
Figure 27:
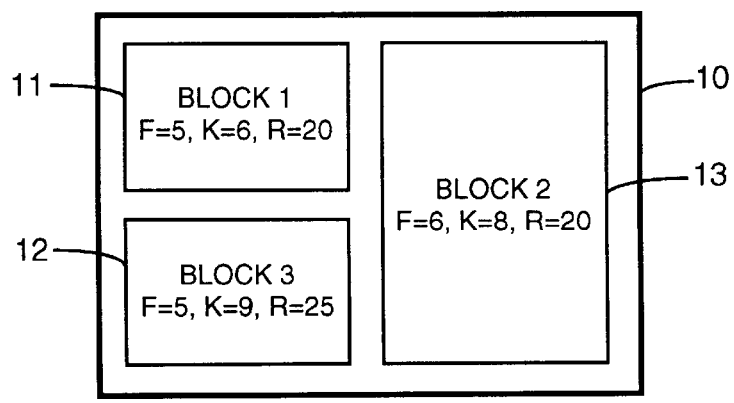

FIG. 27 illustrates the case where the logic function to be implemented is divided into three circuit blocks, and the design flow of FIG. 8 is applied to each circuit block independently.

DETAILED DESCRIPTION OF THE PREFERRED EMBODIMENT

In accordance with this invention, a module-based architecture and a new design methodology using such architecture enable implementation of customized VLSI designs which consume minimal silicon area with excellent power consumption and time delay characteristics using highly automated design procedures. The devices manufactured in accordance with the present invention are fully customized at the outset and are subsequently manufactured to meet the needs of a specific design.

The new design methodology and the module-based architecture serve two primary goals: (1) minimize silicon area, power consumption, and propagation delays, and (2) enable quick implementation of any logic function of any degree of complexity. The first goal is achieved through integrating Pass Transistor Logic (PTL) technology with a very efficient and flexible module-based architecture, and the second goal is achieved through a highly automated design procedure. A general description of the architecture and the design procedure is provided first, and then an example is used wherein a specific logic function is implemented in accordance with the design methodology of the present invention.

Figure 1:
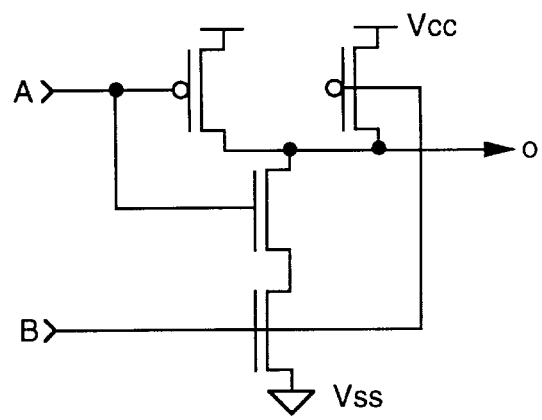
FIG. 1 shows the circuit schematic of a standard cell (a 2-input NAND gate) in CMOS technology.
Figure 2:
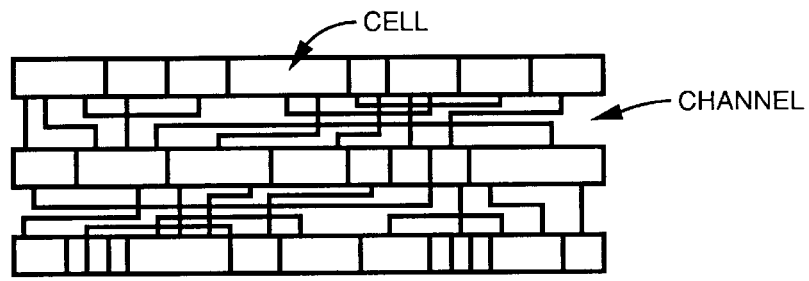
FIG. 2 shows a typical circuit layout in a standard cell approach.
Figure 3:
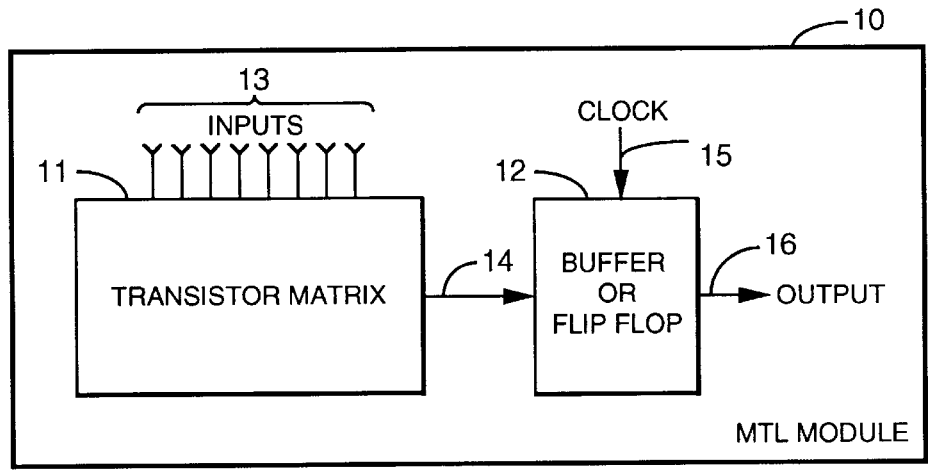
FIG. 3 shows a general block diagram of an MTL module.

At the core of the new architecture is what is named the Matrix Transistor Logic (MTL) module. FIG. 3 shows a general block diagram of the MTL module 10. As shown, the MTL module 10 consists of a Transistor Matrix section 11 and an output section 12. The Transistor Matrix section 11 receives input signals via the input terminals 13 and provides an output signal to the output section 12 on terminal 14. The Transistor Matrix section 11 can be viewed as a general logic engine for implementing logic functions. This section is highly versatile due to the use of a very simple element as the building block. The output section 12 receives an input signal on terminal 14 and the clock signal on input terminal 15 (for sequential designs), and provides an output signal on output terminal 16. Section 12 functions as an output stage and may be used either as a buffer for driving a capacitive load, or as a Flip-Flop (registered) output stage.

In accordance with the present invention, a function (typically described in behavioral or structural language) to be implemented in silicon, is first reduced to logic using a synthesis tool. The logic is then selectively partitioned into an optimum number of MTL modules which are subsequently routed to one another. The modules may be different in size depending on the optimum division of the logic. This flexibility in the size of each module coupled with a highly versatile internal architecture enable an extremely dense implementation of any VLSI logic function.

Figure 4:
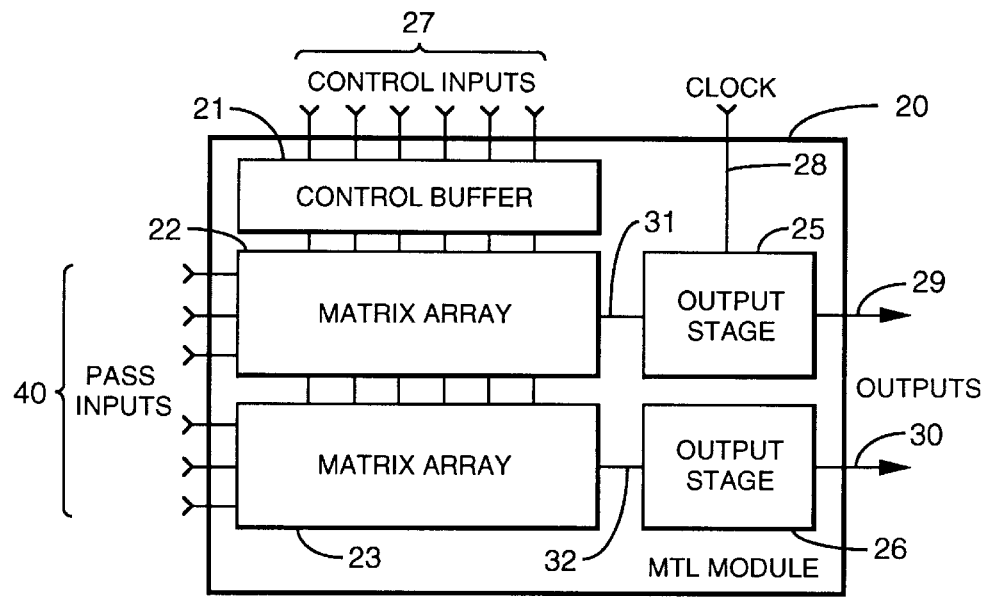
FIG. 4 shows a more detailed block diagram of a multi-output MTL module.

FIG. 4 depicts a more detailed block diagram of a multi-output MTL module 20. The MTL Module 20 consists of a control buffer section 21, two matrix arrays 22 and 23, and two output stages 25 and 26. The number of input terminals to an MTL module as well as the number of matrix arrays and output stages depend upon how the total logic is divided among one or more MTL modules. The number of input terminals, matrix arrays and output stages in FIG. 4 are arbitrary and are intended only to illustrate the general architecture of an MTL module.

In FIG. 4, the control buffer section 21 receives a set of input signals, hereinafter referred to as the control input signals, on the input terminals 27 and provides "true" and "complement" signals of the control input signals for use by the matrix arrays 22 and 23. The matrix arrays 22 and 23 also receive a set of input signals, hereinafter referred to as the pass input signals, on input terminals 40, and provide output signals on terminals 31 and 32, respectively. Terminals 31 and 32 in turn feed output stages 25 and 26. The output stages 25 and 26 also receive the clock signal on input terminal 28, and provide output signals on output terminals 29 and 30. The matrix arrays 22 and 23 form what was earlier referred to as the logic engine of the MTL module 20. The actual logic functions are implemented in these sections using Pass Transistor Logic technology.

Figure 5A:
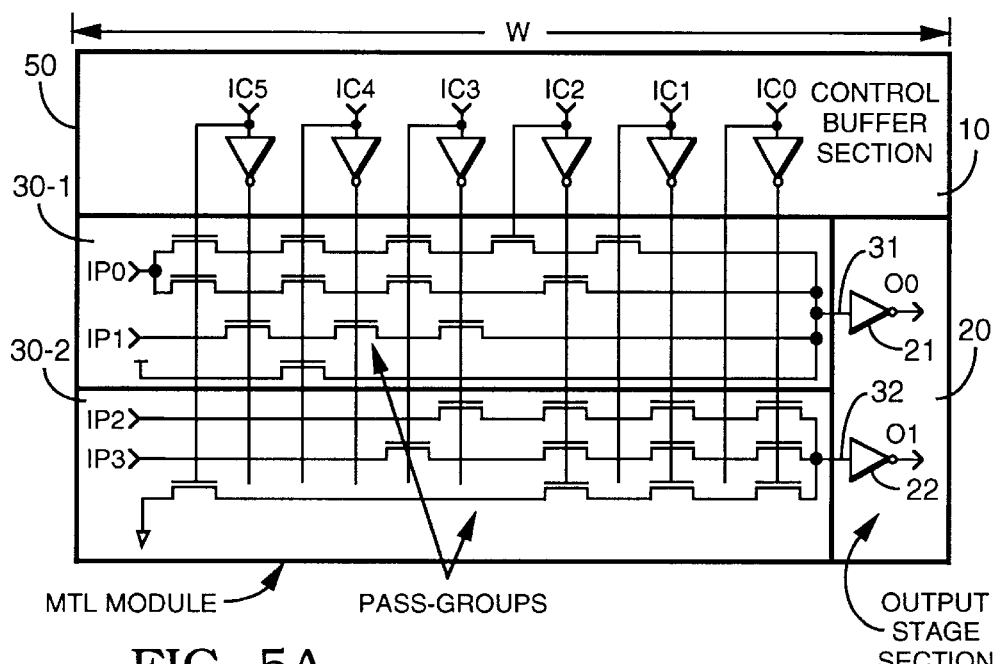
FIG. 5A shows an example of the internal circuitry of the different sections of a multi-output MTL module.

FIG. 5A shows an example of the internal circuitry of the different sections of an MTL module 50. As shown, the control buffer section 10, which consists of a number of inverters, receives the control input signals IC0–IC5 and provides these same signals as well as their complements to the pass-group sections 30-1 and 30-2. Pass-group sections 30-1 and 30-2 also receive pass input signals IP0–IP3, VCC and VSS. As shown, the two pass-group sections 30-1 and 30-2 consist of a number of chains of serially-connected pass transistors. Each of the pass-groups 30-1 and 30-2 implements a specific logic function using the basic principles of Pass Transistor Logic (PTL) technology. As shown, in each of the pass-groups 30-1 and 30-2, the chains of pass transistors are shorted together at one end providing the pass-group output terminal. Terminals 31 and 32 in FIG. 5A represent the output terminals for the pass-groups 30-1 and 30-2, respectively.

The output stage section 20 is shown as including two inverters 21 and 22, one for each pass-group. Naturally, additional inverters (an be added to section 20 if additional pass-groups are used. Inverters 21 and 22 receive the signals on terminals 31 and 32 and provide output signals on output terminals 00 and 01, respectively. The output stage section 20 includes a number of inverting buffers, each of which implements what is commonly referred to as a combinatorial output stage. However, Non-inverting combinatorial buffers, as well as sequential output stages (i.e. flip-flop registers) may be implemented for applications requiring such functions.

Figure 5B:
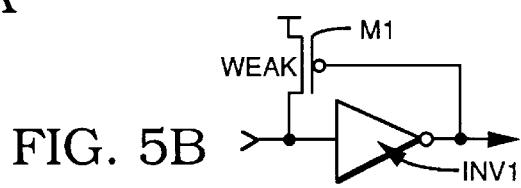
FIG. 5B shows an example of a signal-restoring circuit which may be used in the output stage section of the MTL module of FIG. 5A

As mentioned earlier, due to the characteristics of the field effect transistor used as a pass transistor, the voltage level of the logic high signal is degraded. Typically, the logic high signal at terminals 31 and 32 would be at one threshold voltage (VT) below the power supply VCC, e.g., for VCC=5 V and VT=1 V, the high voltage level at terminals 31 and 32 would be: VCC−VT=5 V−1 V=4 V. Therefore, the signals at terminals 31 and 32, prior to being transmitted as the output signals of the MTL nodule 50, need to be restored to the full power supply levels. FIG. 5B shows an example of a signal-restoring circuit which may be used in the output stage section 20 of the MTL module 50 of FIG. 5A. As shown, a weak feedback p-type transistor M1 is used to restore the high voltage level at the input terminal of inverter INV1. This is one of a number of different approaches for signal-restoring.

Figure 6:
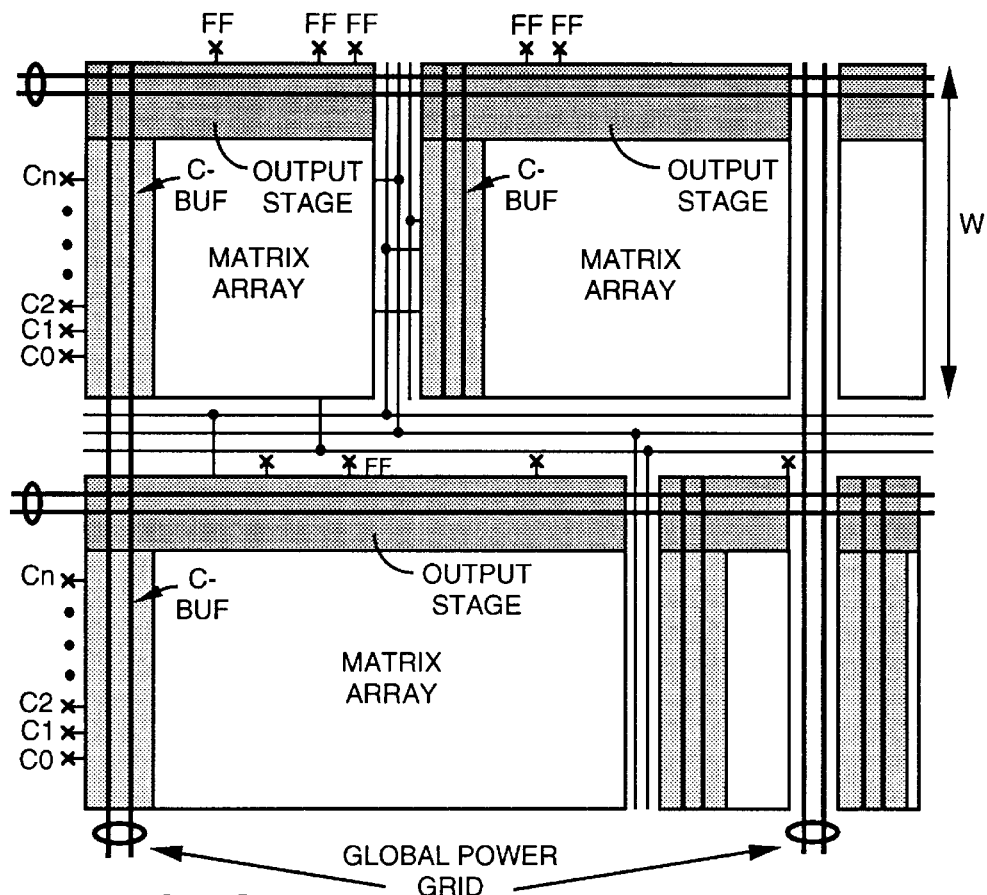
FIG. 6 shows the layout representation of a set of six multi-output MTL modules which have been assembled using a place and route program.
Figure 7:
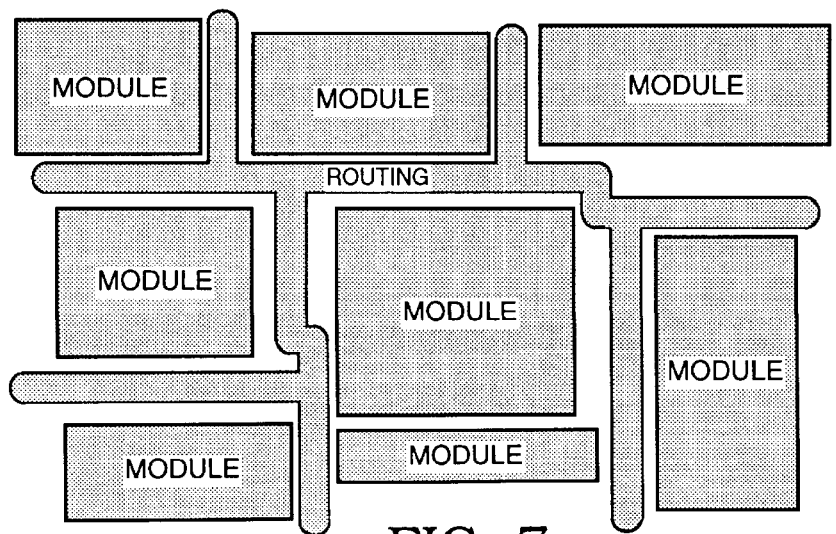
FIG. 7 shows the ad hoc nature of assembling logic modules with random aspect ratios using place and route program.

From the above descriptions and those that will follow, it becomes apparent that the MTL modules, standing on their own as well as collectively, are organized in a structured manner. This characteristic of the MTL module lends itself well to automated place and route. Generally, place and route programs are used to assemble and route the different sections of a circuit into a full chip. FIG. 6 shows an example of the layout representation of a set of six multi-output MTL modules which have been assembled using a place and route program. As shown, each MTL module comprises a control buffer (C-BUF), an output stage and a matrix array. A very important aspect of the architecture is illustrated in FIG. 6. Each MTL module block is fixed in the vertical dimension, while the horizontal dimension is un-restrained and may vary from one MTL module to another. The fixed dimension is indicated as W in FIG. 6 and the corresponding dimension is also marked as W in FIG. 5A (the MTL modules in FIG. 6 are rotated 90° as compared to that shown in FIG. 5A). Fixing one dimension of the MTL modules results in an efficient place and route, because it provides some structure for the place and route program to work with. This can be seen by contrasting FIG. 6 with FIG. 7 in which logic modules with no specific aspect ratios are placed and routed in a random fashion, thereby resulting in area loss as well as inefficient routing of signals.

A significant advantage of the design methodology of the present invention over other approaches is realized in implementing a logic function that has multiple-outputs. Due to the highly structured nature of the MTL module architecture, significant reductions in both area and power are achieved by sharing resources in implementing multiple-output logic functions. More specifically, the module architecture enables sharing of the control buffer section among a number of logic blocks. This aspect of the module architecture will become more clear in the descriptions to follow.

A general and brief description of the design flow, in accordance with the design methodology of the present invention, is provided next. Three interrelated steps need to be carried out to implement a given logic function: 1) design entry, 2) logic optimization, and 3) logic implementation.

Design entry may be accomplished through either schematic entry using a schematic capture program or text-based entry such as Verilog-HDL (Hardware Description Language), Boolean expressions or state machine language. Regardless of the method of initial design entry, the circuit description is usually translated into a standard form such as Boolean expressions. The Boolean expressions are processed by a synthesis tool, which manipulates the expressions. The goal is to modify these expressions, primarily by reducing the complexity of the network, and to optimize the area-speed-power of the final circuit. This optimization usually performs the equivalent of an algebraic minimization of the Boolean expressions. The modifications applied to the network typically include redundancy removal and common subexpression elimination. Since this phase does not consider the type of element that will be used for the final circuit, it is called technology-independent logic optimization.

After the Boolean expressions are optimized, the following two steps are carried out using implementation tools: a) map the logic into a circuit of MTL module blocks, and b) determine an optimal placement and routing of the logic (place and route). The design implementation tools, in accordance with the present invention, apply a high degree of automation to these tasks.

In the mapping stage, the optimized Boolean expressions are transformed into a network of MTL module blocks. The resulting network is then optimized to reduce a cost function that typically incorporates measures of area, power and speed. In the place and route stage, the MTL modules are assembled into a full chip using a Place and Route (P&R) program.

With the above general description of the module-based architecture and the design flow, an example will now be used to further clarify the specific architectural features as well as each of the steps involved in the silicon implementation of a logic function.

FIG. 8 shows the design flow in accordance with the present invention. This design flow provides a highly efficient means of implementing any VLSI logic function. The description that follows describes each step of the design flow as it applies to the present example. Bold border lines are used for blocks 3, 5, 7, 10 and 12 in FIG. 8 to indicate that these blocks contain programs for implementing specific functions, while all other blocks contain data files.

The logic function that is used as the example, is a "memory map circuit" which performs the function of decoding a given address space. FIG. 9 shows a pin diagram of this circuit 20. As shown in FIG. 9, the low address bits AL[7:0] are provided on input terminal 10 and the high address bits AH[7.0] are provided on input terminal 11; Address Strobe (AS) signal is provided on input terminal 12; Reset (RST) signal is provided on input terminal 13; the Clock (CLK) signal is provided on input terminal 14; the output signals A, B, C, D, E, F, G and H ([A:H]) are available on output terminal 15; and the output signal Bus Error (BE) is available on output terminal 16.

Table 1 shows the truth table for the memory map circuit 20. As shown in row 1, with the RST signal in the high state (shown as true or "T"), regardless of the state of the AS or CLK or address input signals, all output signals are reset to a low level. In row 2, with the RST and the AS input signals in a low state (shown as false or "F"), when the CLK input signal makes a low to high transition, regardless of the state of the address input signals, the output signals A through H are reset to a low state and the BE output signal remains unchanged. In row 3, with the RST and the AS input signals in a low and high states, respectively, and the CLK signal in a low state, all output signals remain unchanged regardless of the state of the address signals. Rows 4 through 12 show how the address space is decoded. For example, for the address space FFFF to F000, output signal A is selected; for the address space EFFF to E800, output signal B is selected; for the address space E7FF to E400, output signal C is selected; and so on. As rows 4 through 12 of Table 1 indicate, the RST and the AS signals are in low and high states, respectively, and the output signals change on the low to high transition of the CLK input signal.

I. Verilog-EDL Description of the Memory Map Circuit:

With the truth table of the memory map circuit available, the first step in the implementation process is to provided a high level language description of the truth table. This step is represented by block 1 in the flow chart of FIG. 8. As shown, Verilog-HDL (Hardware Description Language) is used, although other languages such as VHDL may also be used. The Verilog-HDL description of Table 1 is shown in FIG. 10.

In line 1 of FIG. 10 all terminals are defined; in line 2 the output terminals are defined; in line 3 the control input terminals are defined; in line 4 input addresses are defined; in lines 5 and 6 a register is assigned to each of the output signals; in line 7 the low and the high address bits AH and AL are combined into one address bus; in line 8 the output terminal Q is divided into individual output bits A, B, C, D, E, F, G, and H; line 9 modifies all the subsequent lines 10–36 by requiring the output changes to occur on the positive edge of either the CLK or the RST signal; line 10 contains the "begin" instruction for the routine that ends at line 37; lines 11, 12 and 13 correspond to row 1 of Table 1; lines 14 and 15 correspond to row 2 of Table 1; in lines 16, 17 and 18 the output signals are initialized to low level; lines 19 and 20 correspond to row 12 of table 1; lines 21 and 22 correspond to row 11 of table 1; lines 23 and 24 correspond to row 10 of table 1; lines 25 and 26 correspond to row 9 of table 1; lines 27 and 28 correspond to row 8 of table 1; lines 29 and 30 correspond to row 7 of table 1; lines 31 and 32 correspond to row 6 of table 1; lines 33 and 34 correspond to row 5 of table 1; line 35 corresponds to row 4 of table 1.

II. Generation of Boolean Equations from the Verilog-HDL Description:

Next, a synthesis tool is used to convert the Verilog-HDL description of FIG. 10 into a new format, what is referred to in block 4 of FIG. 8 as an "intermediate file". The intermediate file comprises a set of boolean equations which ultimately correspond to the truth table of Table 1. As shown in FIG. 8, block 3, which contains the synthesis program, receives as inputs: (i) the Verilog-HDL description from block 1, (ii) the synthesis library from block 2, and (iii) a value for a variable F, and provides as output the intermediate file in block 4. The variable F places a limitation on the synthesis program whereby the synthesis program is limited to generating equations with a maximum of "F" literals. The significance of the variable F is discussed in more detail in section IIX below.

The synthesis program used in carrying out this step is called Galileo synthesis program by Exmplar Logic, Inc., although other synthesis tools such as Synopsis may also be used. Accordingly, the synthesis program utilizes the synthesis library of block 2 to decompose the truth table of Table 1 into a set of boolean equations, each equation having a maximum of "F" laterals.

Before an in depth analysis of the intermediate file, a brief discussion of the synthesis library of block 2 is in order. The synthesis library provides a set of basic primitives which the synthesis program uses in generating the boolean equations. FIG. 11 outlines the basic primitives in the library. Unlike the Standard Cell approach, the majority of the primitives are function-independent, i.e, they do not implement specific logic functions such as AND, OR, etc. As shown in FIG. 11, lines 1–8 represent the ground terminal "GND"; lines 9–16 represent the power supply terminal "VDD"; lines 17–27 represent a non-inverting buffer; lines 28–38 represent an inverting buffer; lines 39–60 represent a D type flip flop; and lines 61–180 represent generic elements to be used in generating two through nine literals, single-output boolean equations. As can be seen, the function-independent characteristic of the majority of primitives has resulted in a synthesis library with a very small number of elements as compared to the conventional Standard Cell Library.

For the memory map circuit 20 of the present example, with the synthesis library of FIG. 11, and the value "5" designated as the preliminary optimum value for the variable F, the intermediate file shown in FIG. 12 is generated by the Galileo synthesis program. The intermediate file contains a series of equations which correspond to the truth table of Table 1. Lines 1 through 82 of FIG. 12 define the input and output pins of the memory map circuit and assign a register to each output signal as follows: lines 1 through 16 define the address pins; lines 17 through 19 define the control input pins; lines 20 through 28 define the output pins; lines 29 through 82 assign a register or a flip-flop, represented by an instance number, to each of the output signals. All the flip-flops are D type flip-flops having a data (D) input pin, a clock (C) input pin, a clear (CLR) input pin, and an output (Q) pin. Lines 29 through 34 assign the flip flop represented by the instance number 129 (INST__129) to the output signal BE as follows: Line 30 indicates that the input pin D of the flip-flop receives the signal represented by NET__120; line 31 indicates that the input pin C of the flip-flop receives the CLK input signal; line 32 indicates that the input pin CLR of the flip-flop receives the RST input signal; and line 33 indicates that the output pin Q of the flip-flop provides the output signal BE. Each of the subsequent eight flip-flops, each of which correspond to one of the eight output signals A through H in Table 1, are defined in a similar manner.

Lines 83 through 200 define a total of 17 equations, each equation being restricted to a maximum of five different literals and one output. Lines 83 through 88 represent one equation having three inputs and one output as follows: line 83 includes a specific means of designating the equation (i.e., EQN3__XMPLR__NET__118 designates the equation I0*I1*I2) and also includes the equation itself, in this case I0*I1*I2, a three literal AND function; line 84 defines I0 to be the input signal AS; line 85 defines I1 to be the input signal AH<4>; line 86 defines I2 to be an intermediate input signal represented by node n2798; and line 87 defines the output (O) of the equation as NET__118. All subsequent equations are defined in a similar manner. Note that none of the equations contain more than five different literals.

The manner in which each equation is defined is determined by the Galileo synthesis program. The synthesis program provides the least number of equations required in implementing the truth table of Table 1, thereby minimizing thee amount of logic required to implement each equation. The text by Stephen D. Brown et. al., Field-programmable Gate Arrays, Kluwer Academic, (1992), provides an in depth analysis of some of the popular synthesis tools and their algorithms.

III. Generation of a Network of Single-output MTL Modules:

Having generated the equations representing the memory map circuit 20, a program called Pasgen, represented by block 5 in FIG. 8, converts the equations in the intermediate file (block 4 in FIG. 8) into a network of Single-Output MTL Modules (block 6 in FIG. 8). Each Single-Output MTL (SOMTL) module corresponds to a specific equation in the intermediate file, and is a pass transistor implementation of that equation. As an example, a SOMTL module implementation of the equation represented by lines 139 through 144 of FIG. 12 is shown in FIG. 13.

As shown in FIG. 13, the SOMTL module consists of a control buffer section 10, a pass-group section 20 and an output stage section 30. Note, that the SOMTL module of FIG. 13 is simply a single-output version of the multi-output MTL module of FIG. 5A, and as such has a single pass-group section and a single-output stage. As shown, the control input terminals IC00 and IC01 receive signals corresponding to the literals in the equation to which the SOMTL module of FIG. 13 corresponds, namely AH__6 and AH__7. One of the pass input terminals IP01 also receives a signal which corresponds to a literal in the equation, namely, VIRNET__8. The other pass input terminals are connected to the VCC power supply. In the pass-group section 20 of FIG. 13, the NMOS pass transistor is used as the generic element (building block). Pass Transistor Logic (PTL) technology is used in constructing the pass-group section 20. The PTL technology combined with the module-based architecture and the highly automated design flow of the present invention, enables a simple, yet very dense implementation of logic equations of any complexity.

Each SOMTL module in the network of SOMTL modules (Block 6 in FIG. 8) may have a different number of control input signals depending on the total number of literals in each equation. But, none of the SOMTL modules can have control input signals greater in number than the value selected for F, since F represents the maximum number of literals in each equation wherein each of the literals in each equation corresponds to either a pass input signal or a control input signal of the corresponding SOMTL module. Therefore, the maximum number of control input signals in each SOMTL module is limited to F in the synthesis step (block 3 in FIG. 8), and as such the number of control signals in each SOMTL module is always less than or equal to F.

The Pasgen program of block 5 in FIG. 8, described in the article by D. Radhakrichnan et. al., Formal Design Procedures for Pass Transistor Switching Circuits, IEEE JSSCC vol. sc-20, no. 2, April 1985, is one of many different ways of generating the network of SOMTL modules from the boolean equations. Other programs suitable for performing this task may also be used.

IV. Generation of a Network of Packed MTL Modules:

Having converted each equation into a single-output MTL module, a Packer algorithm, represented by block 7 in FIG.

8, selectively groups the Single-Output MTL modules into one or more MTL modules. As shown in FIG. 8, block 7, which contains the packer algorithm, receives representations of the Single-Output MTL modules (block 6) along with values for two variables K and R, and generates a network of packed MTL modules (block 8). The contents of the Packer algorithm is described in detail in FIG. 22. The variables K and R place limitations on the Packer algorithm which ultimately restrict the physical dimensions of the MTL modules generated by the Packer algorithm.

The variable R restricts the vertical dimension of the MTL modules (the dimension along the pass input signals) to a maximum size. The Packer algorithm achieves this by limiting the maximum number of rows of pass transistors allowed in the pass-group section of each MTL module, although other means of achieving the same restriction are also available. The variable K restricts the horizontal dimension of the MTL modules (the dimension along the control input signals) to a specific size for all MTL modules. The Packer algorithm achieves this by restricting the control input signals to each MTL module to exactly the same number, although other means of achieving the same restriction are also available.

The variables R and K along with the variable F (defined earlier) are the key factors which: (i) result in the highly structured architecture of the present invention, and (ii) enable the automation of the overall design as depicted by the design flow of FIG. 8. Selection of the proper values for these three variables is an intricate process involving an analysis of power/area/delay trade offs. A detailed description of the power/area/delay considerations are provided in section IIX below.

The ultimate goal of the Packer algorithm is to group the Single-Output MTL (SOMTL) modules in such manner as to minimize the total silicon area consumed by the resulting set of MTL modules. The primary criterion in grouping the SOMTL modules is to minimize the total number of control buffer insertions by sharing the control buffer sections of those SOMTL modules having the most number of common control input signals. To achieve this, the entire network of packed MTL modules is generated for different values of K, and the K value which yields the smallest overall area is selected. An example is provided in FIGS. 14A, 14B and 14C to illustrate this approach in packing.

FIG. 14A shows three SOMTL modules which form the entire set of SOMTL modules for a specific design. The SOMTL module 1 consists of the pass-group section M1 and the control buffer section C1, and has five control input signals S0, S1, S2, S3 and S4 (the output stage sections are not shown for simplicity); the SOMTL module 2 consists of the pass-group section M2 and the control buffer section C2, and has 4 control input signals S2, S3, S4 and S5; and the SOMTL module 3 consists of pass-group section M3 and the control buffer section C3, and has five control input signals S3, S4, S5, S6 and S7.

To arrive at the most efficient packing of the three SOMTL modules, the Packer algorithm is executed for different values of K. The packing result for two values of K is shown in FIGS. 14B and 14C, although normally a wider range of K values are tested. FIG. 14B represents the packing result for K=8. With K=8, since the three SOMTL modules have the requisite common control input signals (namely, S2 is common between SOMTL modules 1 and 2; S3 and S4 are common between SOMTL modules 1, 2 and 3, and S5 is common between SOMTL modules 2 and 3), they are integrated into one MTL module. From a comparison of FIGS. 14A and 14B, it is readily apparent that area savings are achieved by removing two of the three control buffer sections in the row of SOMTL modules in FIG. 14A. As shown in FIG. 14B, the three pass groups M1, M2 and M3 share one control buffer section C4. Note however, that in FIG. 14B areas R2 and R3 remain unused.

In general, it can be seen that the packing approach in accordance with present invention relies on. commonalities and sharing of resources to reduce area. FIG. 14C represents the packing result for K=6. As shown, SOMTL modules 1 and 2 are packed into MTL module 1, while the SOMTL module 3 is designated as MTL module 2. Therefore, the three control buffer sections (C1, C2 and C3) of FIG. 14A are reduced to two (C5 and C6). As compared to the single control buffer MTL module of FIG. 14B, the dual control buffer MTL modules of FIG. 14C may at first seem not as area efficient. However, a visual comparison of FIGS. 14B and 14C indicates that the unused portions in FIG. 14B (R2 and R3) consume more area than the unused portions in FIG. 14C (R4, R5 and R6). With the network of packed MTL modules generated for each of tire two K values of 8 and 6, the total area consumed by the network of MTL modules in each case is compared and the one yielding the smallest overall area is selected.

Given the above described packing approach, a further improvement in overall area can be achieved through a technique wherein the optimum K value is allowed to vary within a tolerance limit dictated primarily by the capabilities of the place and route tool (See Cadence Design System Inc. User's Manual on the Place and Route program called "Cell3 ensemble"). This technique yields a further area improvement because, even though the optimum K value provides the most efficient overall area, it however may not be the optimum K value for some of the individual packed MTL modules.

As an example, assume the optimum K value of 8 is arrived at for a collection of 20 SOMTL modules which are packed into a total of 5 MTL modules MTL1–MTL5. The 5 MTL modules are then individually tested for specific K values within the deviation allowed from the optimum value of K=8, in order to determine if a smaller area can be achieved for each individual MTL module. For example, a smaller overall area may be achieved for MTL1 module with K=6 (assuming K=6 is within the allowed deviation) even though the MTL1 module may be split into two or more MTL modules. Other K values within the allowed deviation are tested in a similar manner, and the K value which yields the smallest area is selected for the MTL1 module. The other 4 MTL modules are tested for area improvements in a similar fashion. Therefore, in accordance with this technique, additional area savings can be realized by allowing the optimum K value to vary within predesignated limits.

For the memory map circuit of the present example, FIG. 15 outlines the result of executing the Packer algorithm in FIG. 22 on the Single-Output MTL modules (represented by the boolean equations of FIG. 12) with R and K values set to 6 and 20, respectively. As shown in FIG. 15, the Packer algorithm grouped the Single-Output MTL modules into five multi-output MTL modules MTL0, MTL1, MTL2, MTL3 and MTL4. The Single-Output MTL modules packed into each of the five MTL modules are specified in FIG. 15. For example, MTL0 module consists of the four Single-Output MTL modules represented by i3567 (which corresponds to lines 139–144 in FIG. 12), i3595 (which corresponds to lines 180–184 in FIG. 12), i3592 (which corresponds to lines 175–179 in FIG. 12) and i3577 (which corresponds to lines 151–158 in FIG. 12).

FIG. 16 shows the five MTL modules of FIG. 15 in an expanded format. The format used in FIG. 16 is intended to provide a physical correspondence between the MTL modules in FIG. 16 and the general MTL module architecture shown in FIG. 5A. For example, the control input signals IC00–IC05 in FIG. 16 are placed along the top row of the MTL modules in a similar manner to the control input signals of the MTL module in FIG. 5A. The pass input signals in FIG. 16 are placed along the left most column of the MTL modules, in a similar manner to the pass input signals in the MTL module in FIG. 5A. Also, the rows of the MTL Modules in FIG. 16 are intended to be viewed in a similar manner to the MTL module in FIG. 5A, i.e., rows of serially connected pass transistors.

In FIG. 16, the "XB" or the "XT" indicate the location in which a pass transistor is present. XB indicates that the gate of the pass transistor is connected to the complement control input signal designated at top of the column within which XB is located. XT indicates that the gate of the pass transistor is connected to the true control input signal designated at top of the column within which XT is located. Also, each XB or XT indicates that the corresponding pass transistor has its drain terminal connected either to the source terminal of a neighboring pass transistor or to an output terminal, and its source terminal connected to either the drain terminal of a neighboring pass transistor or to a pass input terminal. For example, the XB located in the top left corner of the MTL0 module in FIG. 16, indicates a pass transistor which has its gate terminal connected to $\overline{IC00}$, its drain terminal driving the output buffer for output terminal O0, and its source terminal connected to VDD power supply.

Also shown along the top row of each MTL module in FIG. 16 are output signals, which indicate how many output terminals each MTL module has. For example, MTL0 module has four output terminals O0, O1, O2 and O3. In FIG. 16, rows 1, 2 and 3 combine to produce output terminal O0; rows 4 and 5 combine to produce output terminal O1; rows 6 and 7 combine to produce output terminal O2; and rows 8, 9, 10, 11 and 12 combine to produce output terminal O3. Each set of rows which combine to produce an output terminal correspond to one specific Single-Output MTL module in FIG. 15. For example, rows 1, 2 and 3 producing output terminal O0 in MTL0 module in FIG. 16 correspond to the Single-Output MTL module represented by i3567 in the MTL0 module in FIG. 15.

FIG. 17 shows the exact circuit implementation of the MTL0 module of FIG. 16. A one to one 15 correspondence can be seen between the MTL0 module of FIG. 16 and that of FIG. 17, i.e., as in FIG. 16, there are a total of 12 rows of pass transistors, 4 output terminals, 6 control input terminals to receive 6 control input signals, pass input signals, and pass transistors the locations of each of which correspond to those of "XB" and "XT" in FIG. 16. Also, FIG. 17 shows the exact pin assignment of each of the control input and pass input terminals. Given that the MTL0 module implements the four sets of equations outlined in FIG. 15, the pin assignments should accordingly conform to the literals in the corresponding four equations in FIG. 12.

Note that, as shown in FIG. 17, the pass input terminals also receive some of the equation literals as input signals. The allocation of the equation literals to the control and pass input terminals is done by the Pasgen program which generate; the Single-Output MTL modules. The Pasgen program allocates the literals in such manner as to generate the most compact set of Single-Output MTL modules.

FIG. 18 provides a Verilog netlist which enables one to determine the pin assignments made by the Pasgen program in generating the Single-Output MTL modules. The exact pin assignments for the control and pass input terminals of the MTL0 module in FIG. 17 was determined from the FIG. 18 netlist. Lines 31–32 and 43–47 in FIG. 18 provide the pin assignments for the MTL0 module of FIG. 17. As an Example, the pin assignment to output O0 in line 43 is found in line 31 to be pin n2798.

FIG. 19 shows the schematic block diagram of the memory map circuit, which corresponds to the network of packed MTL modules represented by block 8 in FIG. 8. The schematic block diagram of FIG. 19 consists of (1) the five MTL modules MTL0 through MTL4, (2) inverters driving the pass input terminals of some of the MTL modules, and (3) flip-flop registers at the output terminals of some of the MTL modules.

V. Layout Generation of Individual MTL Modules

Next, a program called Module Builder (also referred to as Tiler), is used to convert each of the packed MTL modules in the data file shown in FIG. 16, into a physical layout representation. As shown in FIG. 8, block 10, which contains the Tiler program, receives as inputs the network of packed MTL modules from block 8 and the tile library from block 9, and in turn generates what is indicated in block 11 as the layout representation of individual MTL modules.

The tile library consists of the physical layouts of a limited set of basic primitives (or tile circuits) used in constructing each MTL module. FIG. 20 illustrates a basic tile library consisting of five tile circuits. Each block is merely a symbol representing a specific layout arrangement for a tile circuit. Tiles 10 and 20 represent the physical layouts of an NMOS pass transistor and a feed-through (i.e., wire), respectively, and are used in the pass-group section of an MTL module. Tile 30 represents the physical layout of a buffer tile circuit for the control input buffer and pass input buffer sections of the MTL modules. Tiles 40 and 50 represent the physical layouts of a sequential and a combinatorial output buffer, respectively. Each tile circuit is optimized for power, speed and propagation delay. Note that since tiles 30, 40 and 50 also perform buffering functions, drive options may also be provided, i.e., 1X, 2X, etc. The Tiler program combines the appropriate tiles from the tile library 90 in preparing the physical layout of each of the MTL modules.

VI. Place and Route:

Having generated the layout representation of individual MTL modules, next, a place and route program is used to assemble the entire chip. As shown in the flow chart of FIG. 8, block 12, which contains the place and route program, receives the layout representation of the individual MTL modules from block 11 along with the MTL modules interconnect information from block 8, and generates what is indicated in block 13 as the complete layout of the chip.

Execution of the place and route program initially results in placing the MTL modules and any other circuit blocks in horizontal rows and subsequently interconnecting the MTL modules and the circuit blocks. In routing the different blocks together, the router uses horizontal and vertical channels to complete the task. The place and route programs generally attempt to minimize the total length of the interconnects, thereby minimizing the propagation delays in time-critical connections. Traditional place and route programs developed for standard cell designs, which operate on a row-based or channel-based approach, may be used.

FIG. 21 shows the outcome of executing the place and route program on the tiled MTL modules. The specific place and route approach of FIG. 21 places the MTL modules in one or more rows (as illustrated by rows 220 and 230), and other circuitries, performing such functions as buffering as well as synchronous logic functions, in a row separate from the rows of MTL modules (as illustrated by row 210). Row 210 typically includes the pass input buffer section, any additional buffering needed for driving large capacitive nodes, flip-flop registers and latches. Therefore, this place and route approach places MTL modules in pairs of rows with a row of circuitries in between, wherein resources used by the two outer rows of MTL modules as well as other required circuitries are placed in the center row.

VII. The Packer Algorithm:

FIG. 22 shows the Packer algorithm in its simplest form. The Packer algorithm is designed to selectively group together Single-Output MTL mocules in such a manner as to minimize the total number of control input buffer insertions, thereby minimizing the overall area consumed by the MTL modules.

Initially, three pieces of information are provided as inputs to the algorithm: 1) the set S0 of all Single-Output MTL modules generated by the Pasgen program, 2) the maximum number of rows "R" allowed in the final set S2 of packed MTL modules, and 3) the maximum number of control input pins "K" in the final set S2 of packed MTL modules. The outcome of executing the algorithm is a packed set S2 (designated as the output in FIG. 22) of MTL modules, each MTL module having one or more output terminals.

The variables used by the algorithm are then defined. S1 represents the current set of Single-Output MTL modules selected for packing. The letter "r" represents the current total number of rows in set S1. The letter "k" represents the current total number of different control input pins in set S1.

Upon executing the algorithm, in step 0 the inquiry is whether there are any Single-Output MTL modules in set S0. If none is found, no packing takes place and the algorithm is terminated. However, if one or more Single-Output MTL modules are found in set S0, step 1 is carried out, in which the contents of all three variables, namely, S0, r and k are cleared. In step 2, the following arithmetic operation is carried out for every Single-Output MTL module in set S0:

D=D1−D0 where, D0 represents the number of different control input pins removed from set S0 if the particular Single-Output MTL module is moved to set S1; and D1 represents the number of different control input pins added to set S1 if the particular Single-Output MTL module is moved to set S1.

Step 3 involves a selection process in which all the Single-Output MTL modules in set S0 are tested for 2 conditions, and the Single-Output MTL module satisfying both conditions is moved to set S1. The two conditions are: 1) the Single-Output MTL module must have the smallest value D, and 2) the Single-Output MTL module must satisfy the following equations:

$r+r_i \geq R$ $k+D1 \geq K$ where $r_i$ represents the number of rows in the Single-Output MTL module being tested. If two or more Single-Output MTL modules meet the two criteria, any of those Single-Output MTL modules may be selected. Given that a Single-Output MTL module is found which satisfies both conditions, it is moved from set S0 to set S1, and the value of "r" and "k" are updated as follows:

$r=r+r_i$ k=k+D1

This update reflects the changes in the number of rows as well as in the number of control input pins in set S1 resulting from the addition of the new Single-Output MTL module to set S1. After updating "r" and "k", the algorithm goes back to step 2 to look for another potential Single-Output MTL module in set S0 to be moved to set S1. In this wanner, all Single-Output MTL modules in set S0 that meet the two conditions are moved to set S1, and when no Single-Output MTL modules are found in set S0, the algorithm jumps to step 4, in which one of two actions are taken. If set S1 contains; no Single-Output MTL modules, the algorithm stops, which indicates that no packing is possible for the given R and K limitations. However, if set S1 does contain one or more Single-Output MTL modules, they are grouped together for implementation as one packed MTL module, and the algorithm loops back to step 0 and the entire cycle is repeated. The full execution of the algorithm may result in one or more packed MTL modules.

IIX. Variables F, K and R:

The three variables F, K and R are closely related, and together impact three key aspects of the design: (1) silicon area consumption, (2) power consumption, and (3) propagation delay. As such, a cost-benefit analysis between the three competing interests of speed, power and area needs to be carried out in order to arrive at optimum values for F, K and R. The significance of each of these variables is discussed next.

The variable R represents the maximum number of rows allowed in each MTL module. Arriving at an optimum value for R involves a balancing of area versus speed. Generally, from a packing stand point, larger value Rs are more desirable since more rows enable packing more Single-Output MTL modules into one MTL module. However, selecting excessively large values for R can adversely affect the area as well as time delays.

For example, in the MTL nodule of FIG. 5A it can be seen that as the number of rows in the module are increased, the number of pass transistor gates that the control buffer inverters are required to drive increases accordingly. Therefore, to maintain the same speed performance for larger value Rs, the inverters in the control buffer section 10 need to be made larger. Each of the inverters in the control buffer section 10 is physically laid out in a pitch limited by the small size of each pass gate. Thus, any increase in inverter sizes results in rapid increase in the height of the control buffer section 10. Note, that due to the small pitch within which the control buffer inverters are laid out, the height of the control buffer section relative to other sections of the MTL modules is quite large. Therefore, the control buffer section of the MTL modules could potentially consume a significant amount of silicon area, further emphasizing the importance of a careful selection of a value for R.

Another important factor in determining a proper value for R is that the control buffer inverters are usually designed to provide effective drive for a maximum number of rows of pass transistors represented by "R". Typically, many of the MTL modules have fewer rows than the maximum number allowed. For these MTL modules the control buffer inverters provide excess drive, leading to inefficient use of area by the control buffer sections of these MTL modules. Therefore, to minimize such area inefficiencies, it is critical not to select an excessively large value for R.

The variable F represents the maximum number of literals allowed in each of the boolean equations generated in the synthesis step. The first order consideration in selecting a value for F is time delay. The number of literals in each equation directly reflects the number of pass transistors that are placed in series in one row in the pass-group section of each MTL module. Each pass transistor has an RC (Resistance/Capacitance) time delay associated with it. The total time delay through a chain of serially-connected pass transistors is simply the summation of the RC time delay of each pass transistor. Therefore, larger F values result in longer chains of pass transistors in each row, which in turn results in longer time delays through the rows.

Thus, the range of values for F is limited by time delay considerations. FIG. 23 shows a graph in which the simulation results of the rising as well as the falling time delays through chains of different number pass transistors, in a 0.5 μm process technology, is plotted. Obviously, the time delays reduce with fewer serially-connected pass transistors. Such graphs are used in selecting a value for F.

The variable K represents the number of control input signals in each of the MTL modules. One important attribute of the variable K is that it physically fixes the MTL modules in one dimension. For example, in FIG. 16 variable K is set to 6 and as such all five MTL modules (MTL0 through MTL4) have six control input signals (IC00 through IC05) even though some MTL modules do not use all six control input signals, e.g, MTL4 module does not use IC04 and IC05. In this manner the dimension of the MTL modules corresponding to the control input signals is fixed for all MTL modules. This dimension is designated as W in FIGS. 5A, 6 and 17.

Fixing one dimension of the MTL modules has significant area implications. As illustrated by FIG. 6, the fixed dimension of the MTL modules enable placement of the MTL modules in rows of fixed height. In this manner the interconnects can be routed through well defined horizontal and vertical channels between the modules. This arrangement results in a very efficient and structured place and route as compared to the alternative approach of ad hoc place and route wherein the total chip area is at the mercy of the place and route program's ability to efficiently assemble MTL modules with no specific aspect ratio (see FIGS. 6 and 7).

Note however, that some area loss within some individual MTL modules may result from fixing K to the same value for all the MTL modules. For example, in FIG. 16 wherein K=6, all MTL modules are shown as having six control input signals IC00 through IC05. Even though the MTL0 module utilizes all six control input signals, MTL4 module utilizes only four of the six control input signals, namely, IC00, IC01, IC02 and IC03. Therefore, the space provided for IC04 and IC05 signals remains unused. This minimal area loss however is far outweighed by the area agains resulting from a structured place and route. Furthermore, this area loss within each MTL module is minimized by the place and route technique discussed in section IV above, wherein the fixed height of the modules is allowed to vary within a certain tolerances limit.

With the above general description of the significance of the three variables, the specific methods used in selecting values for F and K will be described next. To arrive at optimum values for F and K, the interplay between the variables F and K and its impact on area, power and speed are analyzed.

FIG. 24 shows a graph of the total area consumed by the MTL modules of a specific design versus the variable K for two different values of F. As indicated by the two curves, for F=5, the smallest area is achieved at K=6; for F=7, the smallest area is achieved at K=8. As between the two curves, the curve for F=5 yields the smaller area. Therefore, the values for F and K which yield the smallest area are 5 and 6, respectively. Graphs similar to that of FIG. 24 are used to determine optimum values for F and K which yield the minimum area. The notion behind the graph in FIG. 24 is that maximum area efficiency is achieved when equations with the most number of overlapping literals are grouped together in one MTL module.

From a time delay point of view, Table 2, which shows the simulation results for the two optimum F and K values in FIG. 24, reveals that the F=5, K=6 combination yields a shorter time delay, namely 3.5 nS. From a power consumption point of view, a similar analysis generates graphs (not shown) of the total power consumption versus the variable K for different values of F, from which the F and K combination that yields the minimum power consumption is extracted. Once all the data pertaining to power, area and delay is available, trade offs may need to be made between the three variables depending upon the goals of the design.

Note that for the majority of designs the value of K should be equal to or greater than the value of F. This characteristic in a design indicates that some packing has in fact occurred. This can be illustrated by way of an example. An MTL module, wherein F is set to 5, consists of the following two equations:

$$EQ1 = (A*B*C)+(D*E)$$

$$EQ2 = (B*C*D)+(E*F)$$

As can be seen, neither equation has more than five different literals, but the combination does (the two equations involve a total of six literals A, B, C, D, E and F). Therefore, while each equation is limited to only 5 literals (F=5), six control input signals (K=6) are needed to pack these two equations into a single MTL module. This exemplifies the majority of designs wherein K≧F.

However, occasionally cases arise in which it may be advantageous to have a K value smaller than F. These cases arise when the optimum implementation of a logic function requires more of the equation literals designated as pass input signals than control input signals. An eight to one multiplexer (8:1 mux) is an example of such cases. An 8:1 mux has eight input terminals, three control input terminals and one output terminal. An 8:1 mux thus is a perfect candidate for allocating the eight input terminals for pass input signals, and the three control input terminals for the control input signals. Therefore, for the MTL module containing the 8:1 mux, the value for K will be 3 since the module will have three control input signals, and the value for F will be 11 since the equation for an 8:1 mux has 11 literals. Accordingly, this arrangement results in an MTL module with K<F.

IX. Some Alternate Embodiments:

FIGS. 17, 19 and 21 represent the embodiment wherein the flip-flop register, pass input buffers and some other circuitries are placed in a separate row from the MTL modules. In an alternate embodiment, represented by FIGS. 25 and 26, the flip-flop registers (40-1, 40-2 and 40-3 in FIG. 25; in sections 30-1 to 30-6 in FIG. 26) and the pass input buffer sections (section 20 in FIG. 25; sections 20-1 to 20-5 in FIG. 26) are included within the MTL module blocks with which they interact (MTL module 10 in FIG. 25; MTL modules 10-1 to 10-6 in FIG. 26). The MTL module blocks are then placed in rows with channels of interconnect between them, as illustrated by the MTL modules 10-1 to 10-6 in FIG. 26.

In the MTL module 10 in FIG. 25, the pass input buffer section 20, as well as the flip flop registers 40-1, 40-2 and 40-3 are placed inside the MTL module block 10. FIG. 25 also shows a different approach used in implementing the pass-group sections. This approach is called the Differential Pass Transistor Logic (DPTL) and is described in detail in the article by Alex Shubat et. al., Differential Pass Transistor Logic in CMOS Technology, Electronics Letters 13, Vol. 22 No. 6, PP. 294–295, March 1986.

The MTL module architectures in FIGS. 17 and 25 and the corresponding layout approaches in FIGS. 21 and 26, respectively, show two of many different approaches that may be used in implementing MTL modules. Note that the general directives of the design methodology of the present invention are the same for all embodiments. Each approach may have a different area/performance implication, and the approach which yields the optimum results typically depends upon the specific goals of the design being implemented.

Also, note that in implementing any logic circuit, the designer may divide the logic function into one or more circuit blocks and apply the design flow of FIG. 8 to each circuit block independently. In this manner, the designer is able to optimize the different sections of the circuit independently by selecting optimum values for variables F, K and R for each circuit block. This is illustrated in FIG. 27 wherein the logic circuit 10 is divided into three circuit blocks 11, 12 and 13, and each block is implemented using different values for variables R, K and F (i.e., for block 1, the values 5, 6 and 20 are selected for F, K and R, respectively; for block 2, the values 6, 8 and 20 are selected for F, K and R, respectively; for block 3, the values 5, 9 and 25 are selected for F, K and R. respectively).

The above description of the present invention is intended to be illustrative and not limiting. The invention is further intended to include all variations and modifications falling within the scope of the appended claims.

We claim:

1. Structure for implementing a VLSI design, said structure comprising:
   a plurality of Matrix Transistor Logic (MTL) modules, each MTL module comprising:
      a control input section for providing a plurality of control input signals;
      an output stage section having at least one input terminal and at least one output terminal; and
      a matrix array section having first and second dimensions, said control input section abutting to said matrix array section along said first dimension, and said output stage section abutting to said matrix array section alone said second dimension, said matrix array section having a plurality of pass-groups, each pass-group comprising one or more chains of serially-connected pass transistors, one end of each of said one or more chains being connected to a source of input signals and the other ends of said one or more chains being connected together and to said at least one input terminal of said output stage section, and each pass transistor having a gate for receiving one of said control input signals,
   each pass-group in said plurality of pass-groups implementing a distinct logic function,
   wherein at least two of said plurality of MTL modules are of different sizes, said plurality of MTL modules being arranged in at least one row so that regions of matrix array section(s) and control input section(s) alternate alone said at least one row of MTL modules, said one or more chains of serially-connected pass transistors extending alone a direction perpendicular to said at least one row of MTL modules, said first and second dimensions of said matrix array section being respectively perpendicular to and parallel to said at least one row of MTL modules.

2. Structure as in claim 1 wherein said control input section comprises a set of input buffers, each input buffer in said set having one pair of output terminals, a first terminal in said pair being capable of carrying a first control input signal from said plurality of control input signals and a second terminal in said pair being capable of carrying the complement of said first control input signal.

3. Structure as in claim 2 wherein said set of input buffers has N pairs of output terminals, each pair of output terminals being capable of carrying a specific control input signal and the complement of said specific control input signal, where N is an integer representing the number of pairs of control input terminals.

4. Structure as in claim 1 wherein said plurality of pass-groups abutting together along a first dimension of said pass groups, said first dimension of said pass-groups being substantially equal to said first dimension of said matrix array section, said first dimension of said pass-groups being perpendicular to said at least one row.

5. Structure as in claim 4 wherein said first dimension of said matrix array section of all said plurality of MTL modules is fixed to a first size, and said second dimension of said matrix array section of all said plurality of MTL modules is limited to a maximum size.

6. Structure as in claim 5 wherein the number of pass transistors in each of said one or more chains of serially-connected pass transistors is limited to a maximum number.

7. Structure as in claim 6 wherein two or more of said plurality of MTL modules are interconnected.

8. Structure as in claim 7 wherein said plurality of MTL modules are placed and interconnected through interconnect channels between adjacent MTL modules using a place and route tool.

9. Structure as in claim 7 wherein said source of input signals is at least one input terminal located along said second dimension of said matrix array section opposite said output stage section.

10. Structure as in claim 9 further comprising a plurality of circuit blocks placed in another row parallel to said at least one row, each circuit block heaving a first dimension perpendicular to said at least one row and a second dimension parallel to said at least one row, wherein said first dimension of all said plurality of circuit blocks is fixed to a second size, wherein said plurality of circuit blocks perform all tasks required by said design other than those performed by said MTL module, and
   said plurality of MTL modules and said plurality of circuit blocks are placed and interconnected using a place and route tool, said interconnections being made through interconnect channels between adjacent MTL modules and between said at least one row of MTL modules and said row of circuit blocks.

11. Structure as in claim 10 wherein each of said plurality of circuit blocks comprises circuitry for performing buffering functions as well as synchronous logic functions.

12. Structure as in claim 10 wherein said plurality of MTL modules are placed in a plurality of rows, and said plurality of circuit blocks are placed in a plurality of rows, each of said plurality of rows of circuit blocks being placed in between a pair of said plurality of rows of MTL modules.

13. Structure as in claim 11 wherein said plurality of circuit blocks comprise:
   a pass input section corresponding to said source of input signals; and
   a flip-flop register or a latch circuit.

14. Structure as in claim 13 wherein said pass input section comprises a set of input buffers, each input buffer in said set of input buffers having one pair of output terminals, a first terminal in said pair being capable of carrying a first pass input signal and a second terminal in said pair being capable of carrying the complement of said first pass input signal.

15. Structure as in claim 9 wherein said output stage section comprises a sequential element, and said source of input signals is a pass input section, said pass input section being abutted to said matrix array section along said second dimension opposite said output stage section.

16. Structure as in claim 15 wherein said pass input section comprises a set of input buffers, each input buffer in said set of input buffers having one pair of output terminals, a first terminal in said pair being capable of carrying a first pass input signal and a second terminal in said pair being capable of carrying the complement of said first pass input signal.

17. Structure as in claim 16 wherein said plurality of MTL modules are interconnected through interconnect channels between adjacent MTL modules using a place and route tool.

18. Structure as in claim 16 wherein said matrix array section implements logic functions using Differential Pass Transistor Logic.

19. Structure as in claim 7 wherein logic functions are implemented in said matrix array section using Pass Transistor Logic.

20. Structure as in claim 7 wherein logic functions are implemented in said matrix array section using Differential Pass Transistor Logic.

21. Structure as in claim 7 wherein said control input section comprises a set of input buffers, each input buffer in said set comprising an inverter for providing a true and a complement signals of each of said control input signals on a pair of control lines extending along a direction parallel to said at least one row.

22. Structure as in claim 7 wherein said output stage section comprises a driver circuit the strength of which is adjusted based on the capacitive load driven by said output stage section.

23. Structure as in claim 7 wherein said output stage section comprises a sequential element for sequential applications.

24. Structure as in claim 23 wherein said sequential element is a flip-flop register or a latch.

25. Structure as in claim 7 wherein said output stage section comprises a signal-restoring inverting buffer.

26. Structure as in claim 7 wherein said output stage section comprises a signal-restoring non-inverting buffer.

27. Structure as in claim 7 wherein an algorithm is used to construct the layout representation of said plurality of MTL modules by selecting appropriate layout primitives from a library comprising a set of basic layout primitives.

28. Structure as in claim 6 wherein said first dimension of said matrix array section of all said plurality of MTL modules is fixed to said first size by fixing the number of said control input signals to a first number.

29. Structure as in claim 28 wherein the number of control input signals for each of said plurality of MTL modules is selected from a range of numbers which includes said first number, wherein for each MTL module a second number is selected from said range which yields the smallest area for said MTL module, said range of numbers being limited primarily by the capabilities of a place and route tool used in placing and interconnecting said MTL modules.

30. Structure as in claim 28 wherein said second dimension is limited to said maximum size by limiting the number of chains of serially-connected pass transistors in said matrix array section of each of said plurality of MTL modules to a maximum number.

31. Structure as in claimed 30 wherein a value is selected for each of said maximum number of pass transistors, said first number, and said maximum number of chains based on power consumption, silicon area consumption, and time delay considerations.

32. Structure as in claim 30 wherein said plurality of pass-groups in said matrix array section of each of said plurality of MTL modules are selected from a collection of pass-groups, each pass-group in said collection corresponding to one of a plurality of boolean expressions, said plurality of boolean expressions representing the design to be implemented, each control input signal received by each of said pass-groups in said collection representing a literal in the corresponding boolean expression, wherein said plurality of pass-groups in each of said MTL modules are selected from said collection based on the number of common control input signals among said pass-groups in said collection, and wherein pass-groups with the most number of common control input signals are placed in a separate MTL module within the limitations set by said first number and said maximum number of chains.

33. Structure as in claim 30 wherein said design is partitioned into a plurality of logic blocks, and for each of said plurality of logic blocks a value is selected for each of said maximum number of pass transistors, said first number, and said maximum number of chains independently of the other logic blocks.

34. Structure as in claim 6 wherein said design is implemented for different combinations of values selected for said first size, said maximum size, and said maximum number of pass transistors and of said different combinations of values the combination of values which results in the small test overall area consumed by said plurality of MTL modules is selected for said first size, said maximum size, and said maximum number of pass transistors.

35. Structure as recited in claim 6 wherein said maximum number of pass transistors reflects the maximum time delay through each of said one or more chains of serially-connected pass transistors which said design tolerates.

36. Structure for implementing a VLSI design, said structure comprising:

a plurality of Matrix Transistor Logic (MTL) modules, each MTL module comprising:

a control input section having a set of input buffers for providing a plurality of control input signals;

an output stage section having a plurality of input terminals and a plurality of output terminals;

a matrix array section wherein one or more chains of serially-connected pass transistors are used to implement logic functions, said matrix array section receiving said plurality of control input signals on a first set of input terminals located along a first dimension of said matrix array section, said control input section abutting said matrix array section along said first dimension of said matrix array section, said matrix array section receiving a plurality of pass input signals on a second set of input terminals located along a second dimension of said matrix array section, and said matrix array section providing a plurality of output signals on a plurality of output terminals connected to said input terminals of said output stage section, said output stage section abutting said matrix array section along said second dimension opposite said second set of input terminals, wherein at least two of said plurality of MTL modules are of different sizes, said plurality of MTL modules being placed in a first row so that regions of matrix array section(s) and control input section(s) alternate along said first row of MTL modules, said one or more chains of serially-connected pass transistors extending along a direction perpendicular to said first row of MTL modules, said first and second dimensions of said matrix array section being respectively perpendicular to and parallel to said first row of MTL modules, wherein said first dimension of said matrix array section of all said MTL modules is fixed to a first size, said second dimension of said matrix array section of all said MTL modules is limited to a maximum size, and the number of pass transistors in each of said one or more chains of serially-connected pass transistors in said matrix array section of all said MTL modules is limited to a maximum number; and a plurality of circuit blocks placed in a second row parallel to said first row, each circuit block having a first dimension perpendicular to said second row and a second dimension parallel to said second row, wherein said first dimension of all said circuit blocks is fixed to a second size, and said circuit blocks perform all tasks required by said design other than those performed by said MTL modules, and said MTL modules and said circuit blocks are placed and interconnected using a place and route tool.

37. Structure as in claim 36 wherein said matrix array section comprises a plurality of pass-groups, each pass-group comprising one or more chains of serially-connected pass transistors extending along a direction perpendicular to said fist row, one end of each of said one or more chains beings connected to one of said input terminals in said second set of input terminals and the other ends of said one or more chains being connected together and to one of said plurality of output terminals of said matrix array section, each pass transistor in said chains having a gate connected to one of said input terminals in said first set of input terminals, said plurality of pass-groups being abutted together along a first dimension of said pass groups, said first dimension of said pass-groups being substantially equal to said first dimension of said matrix array section, wherein each pass-group in said plurality of pass-groups implements a distinct logic function.

38. Structure as in claim 37 wherein said first dimension of said matrix array section of all said plurality of MTL modules is fixed to said first size by fixing the number of said control input signals to a first number.

39. Structure as in claim 38 wherein each of said circuit blocks comprises circuitry for performing buffering functions as well as synchronous logic functions.

40. Structure as in claim 39 wherein said circuit blocks comprise:
 a pass input section having a set of input buffers for providing said plurality of pass input signals; and
 a flip-flop register or a latch circuit.

41. Structure as in claim 39 wherein an algorithm is used to construct the layout representation of said MTL modules by selecting appropriate layout primitives from a library comprising a set of basic layout primitives.

42. Structure as in claim 39 wherein logic functions are implemented in said matrix array section using Differential Pass Transistor Logic.

43. Structure as in claim 39 wherein said plurality of MTL modules are placed in a plurality of rows, and said plurality of circuit blocks are placed in a plurality of rows, each of said plurality of rows of circuit blocks being placed in between a pair of said plurality of rows of MTL modules.

44. Structure as in claim 38 wherein the number of control input signals for each of said plurality of MTL modules is selected from a range of numbers which includes said first number, wherein for each MTL module a second number is selected from said range which yields the smallest area for said MTL module, said range of numbers being limited primarily by the capabilities of said place and route tool.

45. Structure as in claim 38 wherein said second dimension of said matrix array section is limited to said maximum size by limiting the number of chains of serially-connected pass transistors in said matrix array section of each of said MTL modules to a maximum number.

46. Structure as in claim 45 wherein a value is selected for each of said maximum number of pass transistors, said first number, and said maximum number of chains based on power consumption, silicon area consumption, and time delay considerations.

47. Structure as in claim 45 wherein said plurality of pass-groups in said matrix array section of each of said plurality of MTL modules are selected from a collection of pass-groups, each pass-group in said collection corresponding to one of a plurality of boolean expressions, said plurality of boolean expressions representing the design to be implemented, each control input signal received by each of said pass-groups in said collection representing a literal in the corresponding boolean expression, wherein said plurality of pass-groups in each of said MTL modules are selected from said collection based on the number of common control input signals among said pass-groups in said collection pass-groups with the most number of common control input signals are placed in a separate MTL module within the limitations set by said first number and said maximum number of chains.

48. Structure for implementing a VLSI design, said structure comprising:
 a plurality of Matrix Transistor Logic (MTL) modules, each MTL module comprising:
  a control input buffer section for providing a plurality of control input signals;
  a pass input buffer section for providing a plurality of pass input signals;
  an output stage section having a plurality of input terminals and a plurality of output terminals, said output stage section further comprising a sequential element; and
  a matrix array section wherein one or more chains of serially-connected pass transistors are used to implement logic functions, said matrix array section receiving said control input signals on a first set of input terminals located along a first dimension of said matrix array section, said matrix array section receiving said pass input signals on a second set of input terminals located along a second dimension of said matrix array section, said control input buffer section abutting said matrix array section along said first dimension of said matrix array section, said pass input buffer section abutting said matrix array section along said second dimension of said matrix array section, said matrix array section providing output signals on a plurality of output terminals connected to said input terminals of said output stage section, said output stage section abutting said matrix array section along said second dimension opposite said pass input buffer section, wherein at least two of said plurality of MTL modules are of different sizes, said plurality of MTL modules being placed in at least one row so that regions of matrix array section(s) and control input section(s) alternate along said at least one row of MTL modules, said one or more chains of serially-connected pass transistors extending along a direction perpendicular to said at least one row of MTL modules, said first and second dimensions of said matrix array section being respectively perpendicular to and parallel to said at least one row of MTL modules, wherein said first dimension of said matrix array section of all said MTL modules is fixed to a first size, said second dimension of said matrix array section of all said MTL modules is limited to a maximum size, and the number of pass transistors in each of said one or more chains of serially-connected pass transistors in said matrix array section of all said MTL modules is limited to a maximum number, said MTL modules being placed and interconnected using a place and route tool.

49. Structure as in claim 48 wherein said matrix array section comprises a plurality of pass-groups, each pass-group comprising one or more chains of serially-connected pass transistors extending along a direction perpendicular to said at least one row, one end of each of said one or more chains being connected to one of said input terminals in said second set of input terminals and the other ends of said one or more chains being connected together and to one of said plurality of output terminals of said matrix array section, each pass transistor in said chains having a gate connected to one of said input terminals in said first set of input terminals, said plurality of pass-groups being abutted together along a first dimension of said pass groups, said first dimension of said pass-groups being substantially equal to said first dimension of said matrix array section, wherein each pass-group in said plurality of pass-groups implements a distinct logic function.

50. Structure as in claim 49 wherein said first dimension of said matrix array section of all said plurality of MTL modules is fixed to said first size by fixing the number of said control input signals to a first number.

51. Structure as in claim 50 wherein the number of control input signals for each of said plurality of MTL modules is selected from a range of numbers which includes said first number, wherein for each MTL module a second number is selected from said range which yields the smallest area for said MTL module, said range of numbers being limited primarily by the capabilities of said place and route tool.

52. Structure as in claim 50 wherein logic functions are implemented in said matrix array section using Differential Pass Transistor Logic.

53. Structure as in claim 50 wherein said output stage section further comprises a driver circuit the strength of which is adjusted based on the capacitive load driven by said output stage section.

54. Structure as in claim 50 wherein an algorithm is used to construct the layout representation of said MTL modules by selecting appropriate layout primitives from a library comprising a set of basic layout primitives.

55. Structure as in claim 50 wherein said second dimension is limited to said maximum size by limiting the number of chains of serially-connected pass transistors in said matrix array section of each of said MTL modules to a maximum number.

56. Structure as in claim 55 wherein a value is selected for each of said maximum number of pass transistors, said first number, and said maximum number of chains based on power consumption, silicon area consumption, and time delay considerations.

57. Structure as in claim 55 wherein said plurality of pass-groups in said matrix array section of each of said plurality of MTL modules are selected from a collection of pass-groups, each pass-group in said collection corresponding to one of a plurality of boolean expressions, said plurality of boolean expressions representing the design to be implemented, each control input signal received by each of said pass-groups in said collection representing a literal in the corresponding boolean expression, wherein said plurality of pass-groups in each of said MTL modules are selected from said collection based on the number of common (control input signals among said pass-groups in said collection wherein pass-groups with the most number of common control input signals are placed in a separate MTL module within the limitations set by said first number and said maximum number of chains.

58. A method for Implementing a VLSI design, said method comprising the steps of:

generating a plurality of boolean expressions and sequential elements from a high level language description;

mapping each of said boolean expressions into a corresponding single-output Matrix Transistor Logic (MTL) module, each single-output MTL module providing a pass transistor logic implementation of one of said boolean expressions, wherein said single-output MTL modules are to be packed to form multiple-output MTL modules;

receiving a value of a first variable, said first variable setting a portion of a first dimension of each of said multiple-output MTL modules to a first size;

receiving a value of a second variable, said second variable limiting a portion of a second dimension of each of said multiple-output MTL modules to a maximum size;

selectively packing said single-output MTL modules so that they form multiple-output MTL modules wherein at least two of said multiple-output MTL modules are of different sizes, said packing being limited by the first variable and the second variable;

placing said plurality of multiple-output MTL modules in one or more rows, said first and second dimensions of all said multiple-output MTL modules being respectively perpendicular and parallel to said one or more rows; and interconnecting at least two of said plurality of multiple-output MTL modules, wherein a resulting layout area of said design is substantially determined by a resulting layout of said multiple-output MTL modules.

59. A method as recited in claim 58 wherein said packing is carried out for different pairs of values selected for said first and second variables and of said different pairs of values the pair of values which results in the smallest overall area consumed by said plurality of multiple-output MTL modules is selected.

60. A method as recited in claim 58 further comprising the step of:

after said packing step but before said placing step, constructing the layout representation of said multiple-output MTL modules using an algorithm which selects appropriate layout primitives from a library comprising a set of basic layout primitives.

61. A method as recited in claim 59 wherein a third variable is used for limiting the number of literals in each boolean expression generated in said generating step to a maximum number.

62. A method as recited in claim 59 wherein after said first and second values are selected for said respective first and second variables in said packing step, from a range of values a third value is selected for said first variable for each individual multiple-output MTL module, wherein from said range of values said third value yields the smallest area for each individual multiple-output MTL module, said range of values being limited primarily by the capabilities of a place and route tool used in carrying out said placing and said interconnecting steps.

63. A method as recited in claim 59 wherein each of said single-output MTL modules receives a plurality of control input signals, each of said control input signals representing a literal in the corresponding boolean expression, and said packing for each of said different pairs of values being carried out based on the number of common control input signals among said single-output MTL modules wherein for each of said different pairs of values the single-output MTL modules with the most number of common control input signals are packed in a separate multiple-output MTL module.

64. A method as recited in claim 58 wherein each of said multiple-output MTL modules comprises a matrix array section receiving a plurality of control input signals via a first set of input terminals along a first dimension of said matrix array section, each of said plurality of control input signals corresponding to one of said literals in said boolean expressions, said first dimension of said matrix array section corresponding to said portion of said first dimension of said multiple-output MTL modules, said matrix array section having a second dimension corresponding to said portion of said second dimension of said multiple-output MTL modules, said matrix array section comprising a plurality of pass-groups, each of said sass-groups corresponding to one of said single-output MTL modules, each of said pass-groups comprising a plurality of chains of serially-connected pass transistors extending along a direction perpendicular to said one or more rows, each of said pass transistors having a gate for receiving one of said control input signals.

65. Structure as in claim 61 wherein said design is partitioned into a plurality of logic blocks, and said generating step, mapping step, both receiving steps, packing step, placing step, and interconnecting step are carried out for each logic block independently.

66. A method as recited in claim 61 wherein a synthesis tool is used in carrying out said generating step, said synthesis tool generating the least number of boolean expressions from said high level language description within the limitation set by said third variable.

67. A method as recited in claim 58 wherein said synthesis tool uses a synthesis library in generating the boolean expressions, said synthesis library comprising a plurality of basic primitives a substantial number of which are function-independent.

68. A method as recited in claim 64 wherein said first variable fixes said portion of said first dimension of all said multiple-output MTL modules to said first size by fixing the number of said control input signals to a first number, said first number corresponding to said first value.

69. Structure as in claim 64 wherein said matrix array section implements logic functions using Differential Pass Transistor Logic.

70. A method as recited in claim 64 wherein each of said multiple-output MTL modules further comprises:

a control input buffer section for providing said control input signals; and an output stage section having a plurality of input terminals and a plurality of output terminals, wherein said matrix array section receives a plurality of pass input signals via a second set of input terminals located along said second dimension of said matrix array section, said control input section being abutted to said matrix array section along said first dimension, said output stage section being abutted to said matrix array section along said second dimension opposite said first set of input terminals, said first and second dimensions of said matrix array section being respectively perpendicular to and parallel to said one or more rows, wherein one end of each of said chains of serially-connected pass transistors is connected to one of said input terminals in said second set of input terminals and the other ends of said chains are connected together and to one of said plurality of input terminals of said output stage section, and wherein said plurality of pass-groups are abutted together along a first dimension of said pass-groups, said first dimension of said pass-groups being perpendicular to said one or more rows, and said first dimension of said pass-groups being substantially equal to said first dimension of said matrix array section.

71. A method as recited in claim 68 wherein said second variable limits said portion of said second dimension of all said multiple-output MTL modules to said maximum size by limiting the number of chains of serially-connected pass transistors in said matrix array section of each of said multiple-output MTL modules to a maximum number, said maximum number of chains corresponding to said second value.

72. A method as recited in claim 71 wherein said third variable limits the number of said pass transistors in each of said chains of serially-connected pass transistors to a maximum number equal to said maximum number of literals.

73. A method as recited in claim 72 wherein a value is selected for each of said maximum number of pass transistors, said first number, and said maximum number of chains based on power consumption, silicon area consumption, and time delay considerations.

74. A method as recited in claim 72 wherein said maximum number of pass transistors reflects the maximum time delay through each of said chains of serially-connected pass transistors which said design tolerates.

* * * * *